(12) United States Patent
Kodaira et al.

(10) Patent No.: US 7,590,015 B2
(45) Date of Patent: Sep. 15, 2009

(54) INTEGRATED CIRCUIT DEVICE AND ELECTRONIC INSTRUMENT

(75) Inventors: Satoru Kodaira, Chino (JP); Hiroshi Kiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 39 days.

(21) Appl. No.: 11/889,286

(22) Filed: Aug. 10, 2007

(65) Prior Publication Data

US 2008/0055324 A1 Mar. 6, 2008

(30) Foreign Application Priority Data

Aug. 30, 2006 (JP) ............................. 2006-233055
Aug. 30, 2006 (JP) ............................. 2006-233056

(51) Int. Cl.
*G11C 7/00* (2006.01)

(52) U.S. Cl. ............. 365/200; 365/230.03; 365/230.06; 365/230.01

(58) Field of Classification Search ................. 365/200, 365/230.08, 230.06, 230.01, 230.03
See application file for complete search history.

(56) References Cited

U.S. PATENT DOCUMENTS

| | | | |
|---|---|---|---|
| 5,375,090 A | 12/1994 | Yoshida | |
| 5,473,573 A | 12/1995 | Rao | |
| 5,583,822 A | 12/1996 | Rao | |
| 5,701,270 A * | 12/1997 | Mohan Rao | ............ 365/230.03 |
| 6,258,642 B1 * | 7/2001 | Holst | .......................... 438/199 |
| 6,396,748 B1 * | 5/2002 | Fujita | ........................... 365/200 |
| 6,424,584 B1 * | 7/2002 | Seyyedy | ................... 365/225.7 |
| 6,513,130 B1 | 1/2003 | Cross | |
| 6,625,071 B2 | 9/2003 | Ikeda et al. | |
| 6,724,378 B2 | 4/2004 | Tamura et al. | |
| 7,002,822 B2 * | 2/2006 | Kang et al. | ............... 365/49.17 |
| 7,110,294 B2 * | 9/2006 | Kawai | ..................... 365/185.09 |
| 7,283,105 B2 * | 10/2007 | Dallas et al. | ................... 345/32 |
| 7,286,420 B2 * | 10/2007 | Kawai | .......................... 365/200 |
| 7,333,374 B2 * | 2/2008 | Otsuka | ........................ 365/200 |
| 2002/0011998 A1 | 1/2002 | Tamura | |
| 2007/0001982 A1 | 1/2007 | Ito et al. | |
| 2007/0002063 A1 | 1/2007 | Kumagai et al. | |

FOREIGN PATENT DOCUMENTS

| | | |
|---|---|---|
| JP | A 5-36297 | 2/1993 |
| JP | A-05-189995 | 7/1993 |
| JP | A-09-179534 | 7/1997 |
| JP | A-09-508735 | 9/1997 |
| JP | A-11-501435 | 2/1999 |
| JP | A 2001-222249 | 8/2001 |
| JP | A-2002-244624 | 8/2002 |
| JP | A-2003-045196 | 2/2003 |

* cited by examiner

*Primary Examiner*—Viet Q Nguyen
(74) *Attorney, Agent, or Firm*—Oliff & Berridge, PLC

(57) ABSTRACT

An integrated circuit device includes a data driver block, a memory block, an information storage block in which an address of a defective cell of the memory block is programmed and stored as a defective address, and a switch control circuit which performs control for switching access to the defective cell to access to a redundant cell. A row address of the defective cell having the row address and a column address is stored in the information storage block as the defective address. The switch control circuit performs control for switching access to the defective cell to access to the redundant cell by comparing a row address for display panel access with the defective address during the display panel access and comparing a row address for host access using the row address and a column address with the defective address during the host access.

14 Claims, 23 Drawing Sheets

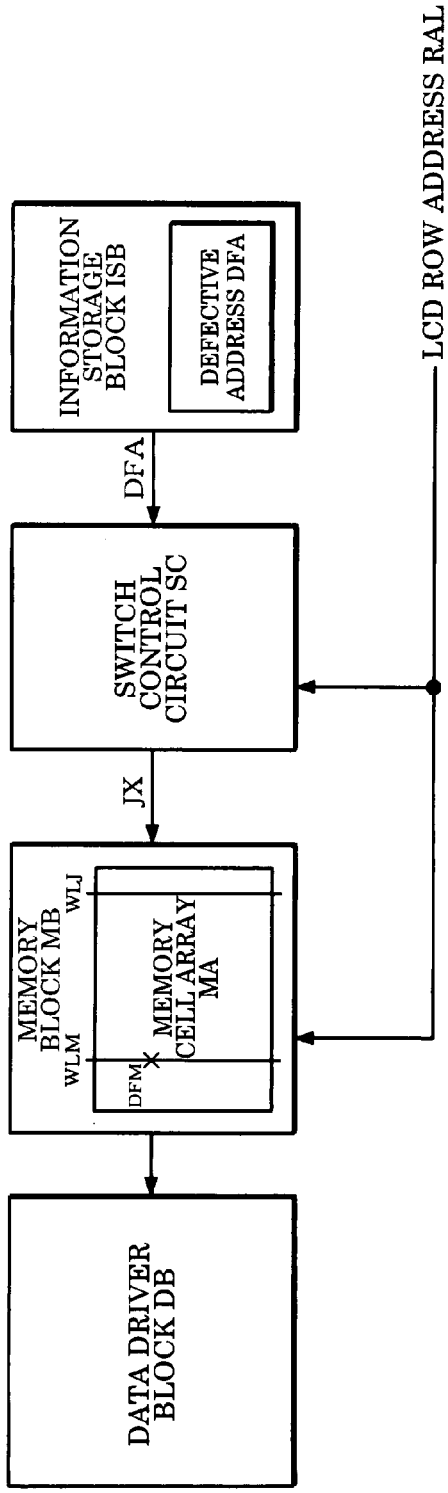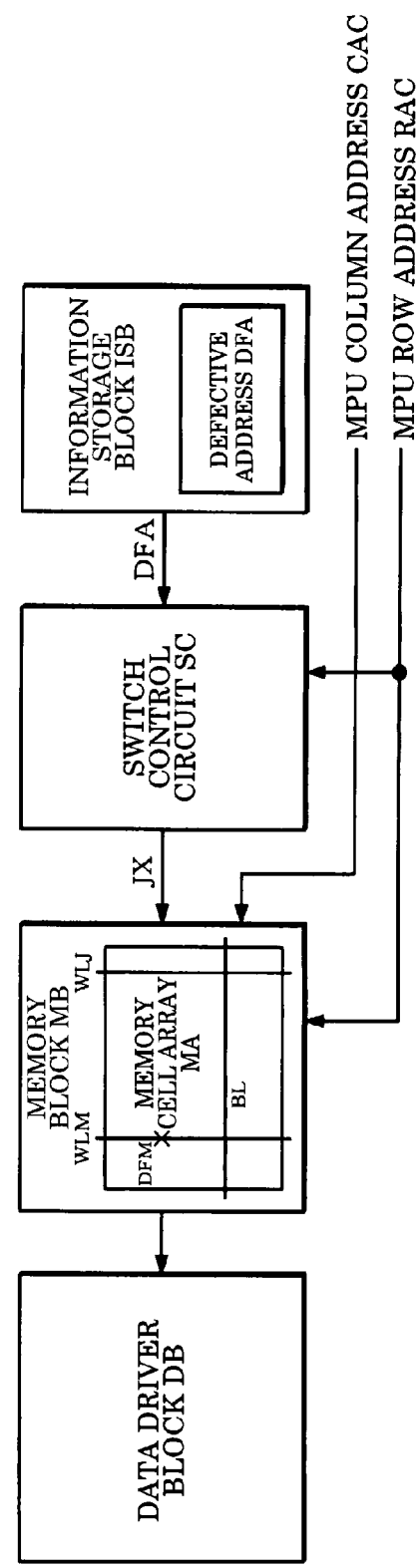
FIG. 2A LCD (DISPLAY PANEL) ACCESS
FIG. 2B MPU (HOST) ACCESS

FIG. 4A  LCD ACCESS
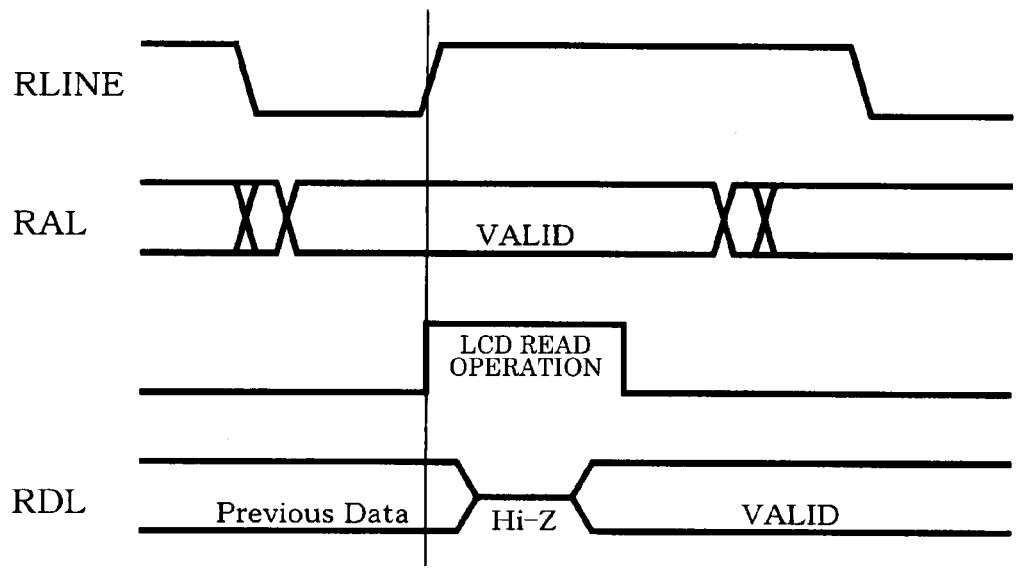
FIG. 4B  MPU ACCESS
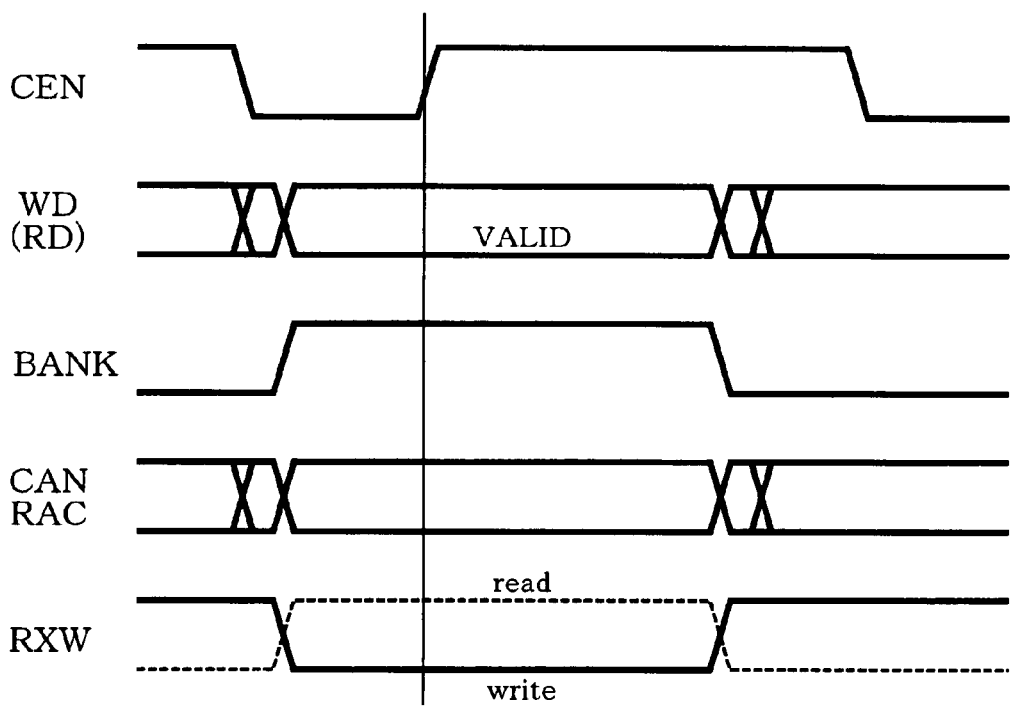

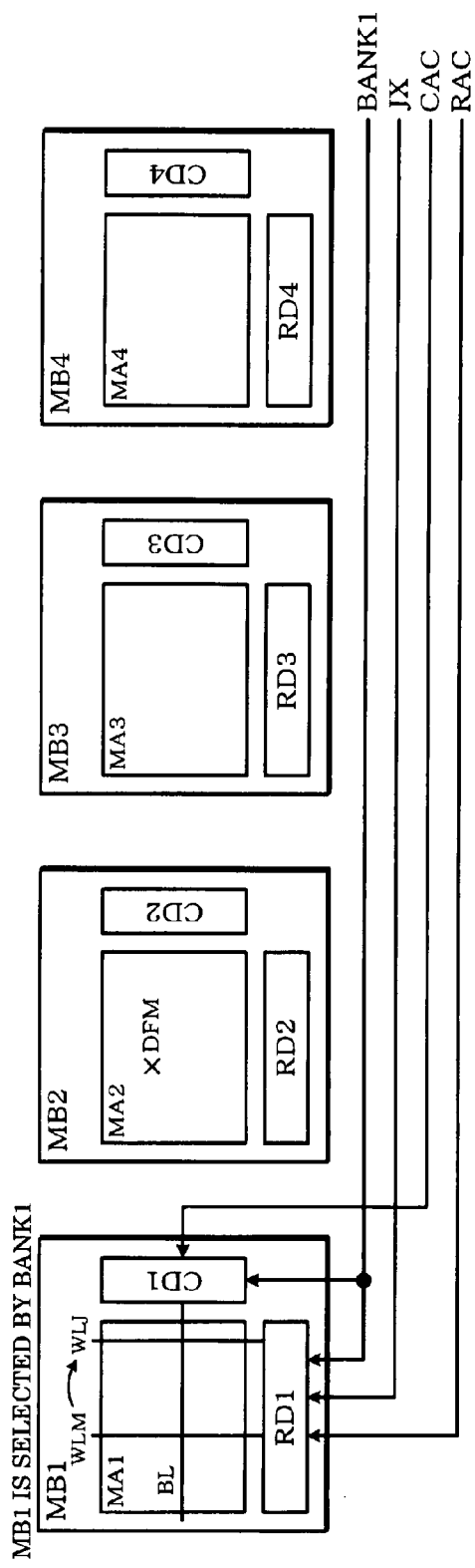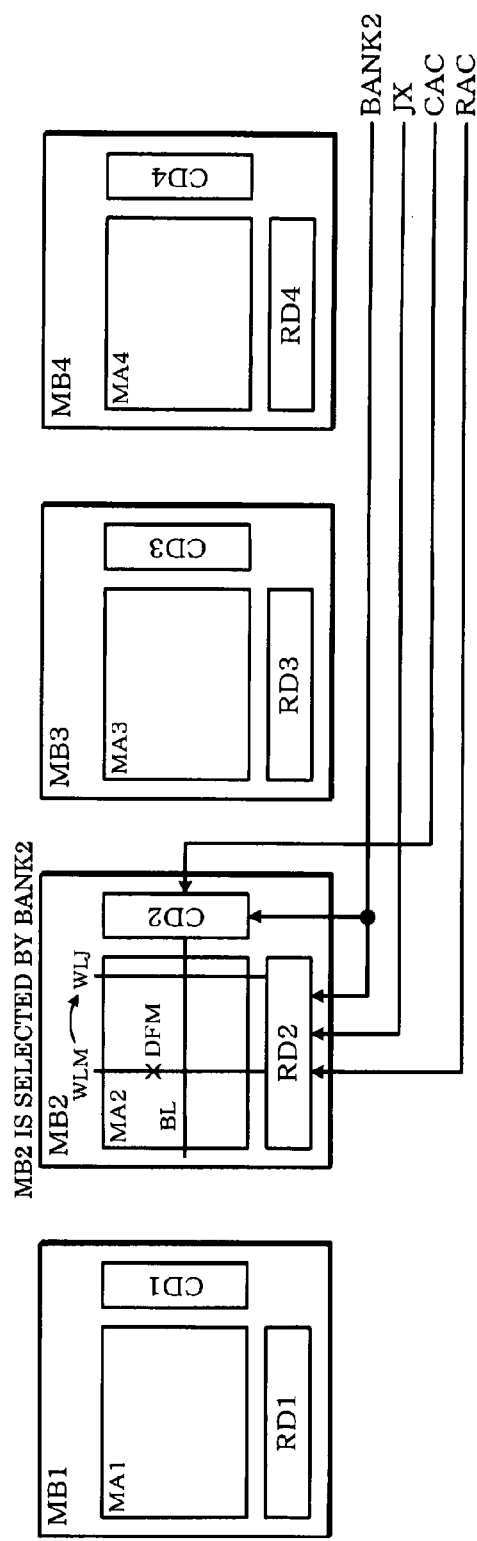

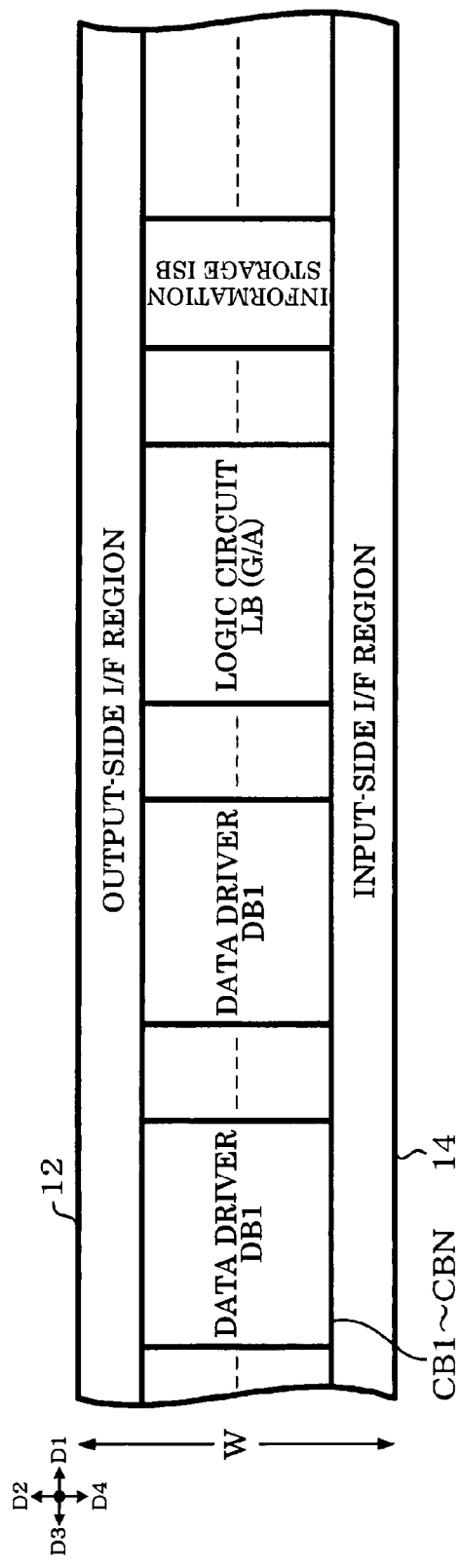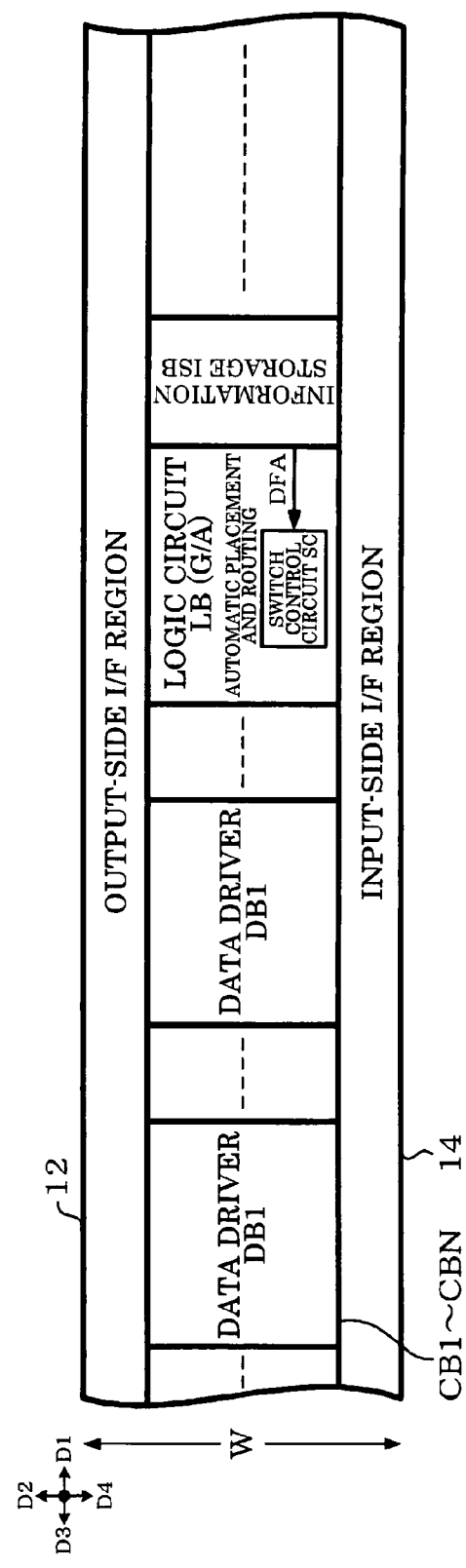

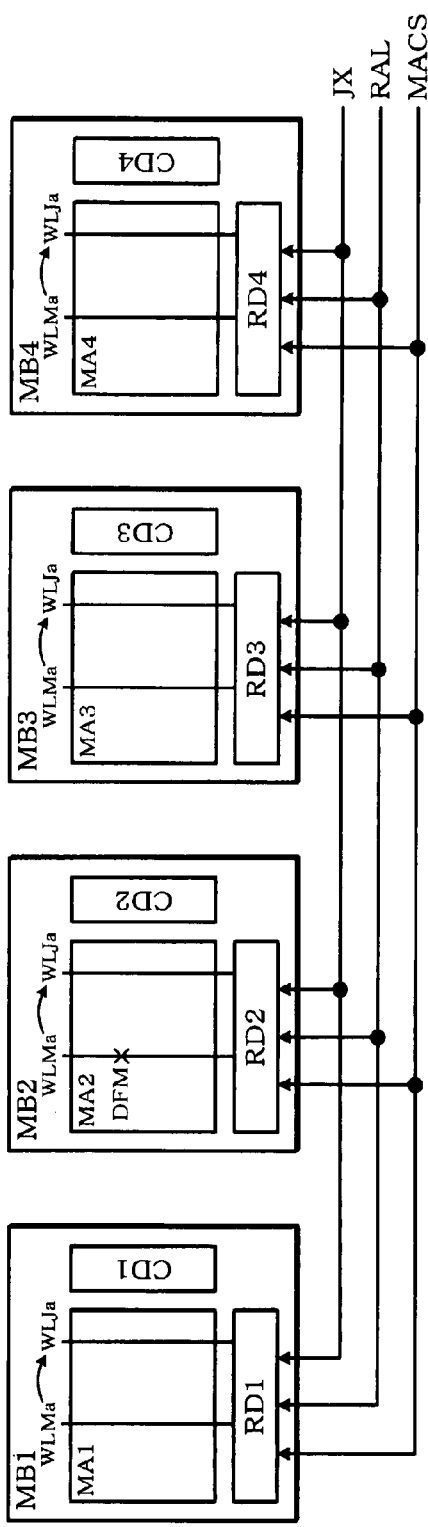
FIG. 22A  FIRST READ OPERATION
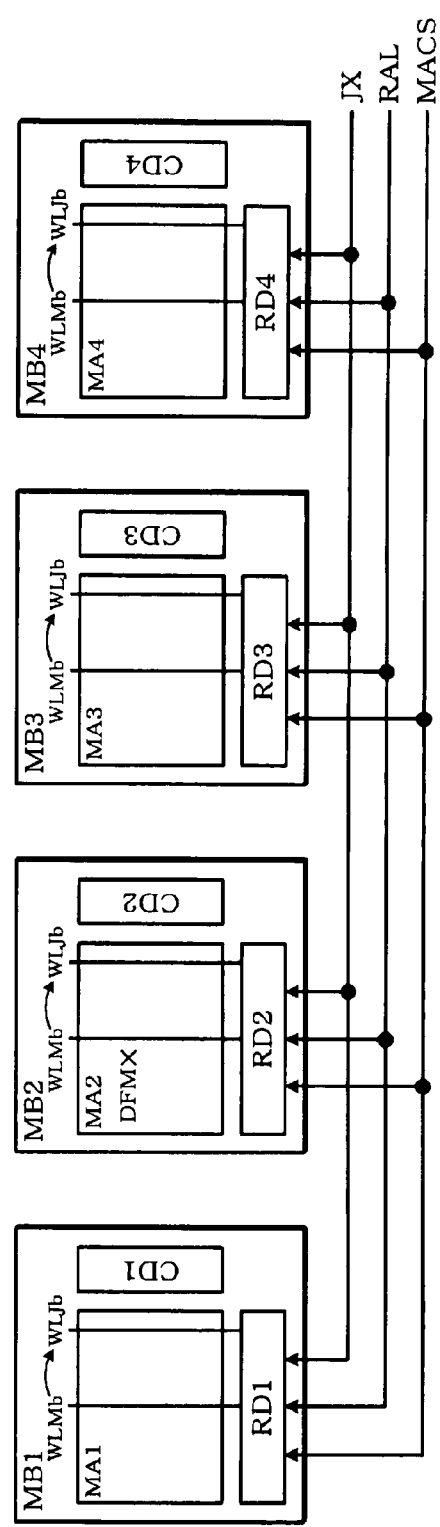
FIG. 22B  SECOND READ OPERATION

INTEGRATED CIRCUIT DEVICE AND ELECTRONIC INSTRUMENT

Japanese Patent Application No. 2006-233055 filed on Aug. 30, 2006 and Japanese Patent Application No. 2006-233056 filed on Aug. 30, 2006, are hereby incorporated by reference in their entirety.

BACKGROUND OF THE INVENTION

The present invention relates to an integrated circuit device and an electronic instrument.

A display driver (LCD driver) is known as an integrated circuit device which drives a display panel such as a liquid crystal panel. A display driver may include a memory (SRAM) which stores image data supplied to a data driver (e.g. JP-A-2001-222249).

The display driver including a memory has a problem in which the yield of the display driver decreases due to a defective cell (defective memory cell or defective bit) which exists in the memory cell array. In recent years, the number of pixels of the display panel and the number of bits of the memory provided in the display driver have been increased. If the number of bits of the memory is increased, the yield decreases to a large extent due to a defective cell of the memory cell array. JP-A-5-36297 discloses a redundant memory selection fuse element.

SUMMARY

According to one aspect of the invention, there is provided an integrated circuit device comprising:

at least one data driver block for driving data lines;

at least one memory block which includes memory cells and redundant cells for repairing a defective cell and stores image data supplied to the data driver block;

an information storage block in which an address of the defective cell of the memory block is programmed and stored as a defective address; and a switch control circuit which performs control for switching access to the defective cell to access to the redundant cell;

a row address of the defective cell having the row address and a column address being stored in the information storage block as the defective address; and the switch control circuit performing control for switching access to the defective cell to access to the redundant cell by comparing a row address for display panel access with the defective address stored in the information storage block during the display panel access which is access for a display operation of a display panel, and comparing a row address for host access, which uses the row address and a column address, with the defective address stored in the information storage block during the host access which is access from a host to the memory block.

According to another aspect of the invention, there is provided an integrated circuit device comprising:

at least one data driver block for driving data lines;

at least one memory block which includes memory cells and redundant cells for repairing a defective cell and stores image data supplied to the data driver block;

an information storage block in which an address of the defective cell of the memory block is programmed and stored as a defective address; and a switch control circuit which performs control for switching access to the defective cell to access to the redundant cell;

a first address of the defective cell, which has an address made up of the first address and a second address, being stored in the information storage block as the defective address; and the switch control circuit performing control for switching access to the defective cell to access to the redundant cell by comparing a first address for display panel access with the defective address stored in the information storage block during the display panel access which is access for a display operation of a display panel and comparing a first address for host access, which uses an address made up of the first address and a second address, with the defective address stored in the information storage block during the host access which is access from a host to the memory block.

According to a further aspect of the invention, there is provided an integrated circuit device comprising:

first to Nth circuit blocks (N is an integer equal to or larger than two) disposed along a first direction when a direction from a first side which is a short side of the integrated circuit device toward a third side opposite to the first side is defined as a first direction and a direction from a second side which is a long side of the integrated circuit device toward a fourth side opposite to the second side is defined as a second direction; and an information storage block in which initial adjustment information for performing an initial adjustment of the circuit block of the integrated circuit device is programmed and stored;

the first to Nth circuit blocks including:

at least one data driver block for driving data lines; and a logic circuit block which controls the data driver block, the logic circuit block being disposed between the data driver block and the information storage block.

According to a further aspect of the invention, there is provided an integrated circuit device comprising:

first to Nth circuit blocks (N is an integer equal to or larger than two) disposed along a first direction when a direction from a first side which is a short side of the integrated circuit device toward a third side opposite to the first side is defined as a first direction and a direction from a second side which is a long side of the integrated circuit device toward a fourth side opposite to the second side is defined as a second direction; and an information storage block in which initial adjustment information for performing an initial adjustment of the circuit block of the integrated circuit device is programmed and stored;

the first to Nth circuit blocks including: at least one data driver block for driving data lines; and a logic circuit block which controls the data driver block; and the information storage block being disposed adjacent to the logic circuit block.

According to a further aspect of the invention, there is provided an electronic instrument comprising:

the above integrated circuit device; and a display panel driven by the integrated circuit device.

BRIEF DESCRIPTION OF THE SEVERAL VIEWS OF THE DRAWING

FIGS. 2A and 2B are views illustrative of an operation according to one embodiment of the invention.

FIGS. 4A and 4B show signal waveform examples during LCD access and MPU access.

FIGS. 6A and 6B are views illustrative of a wordline selection method during MPU access.

FIGS. 14A and 14B are views illustrative of an information storage block arrangement method.

FIGS. 22A and 22B are views illustrative of a method of providing redundant cells of two or more wordlines.

DETAILED DESCRIPTION OF THE EMBODIMENT

Figure 1:
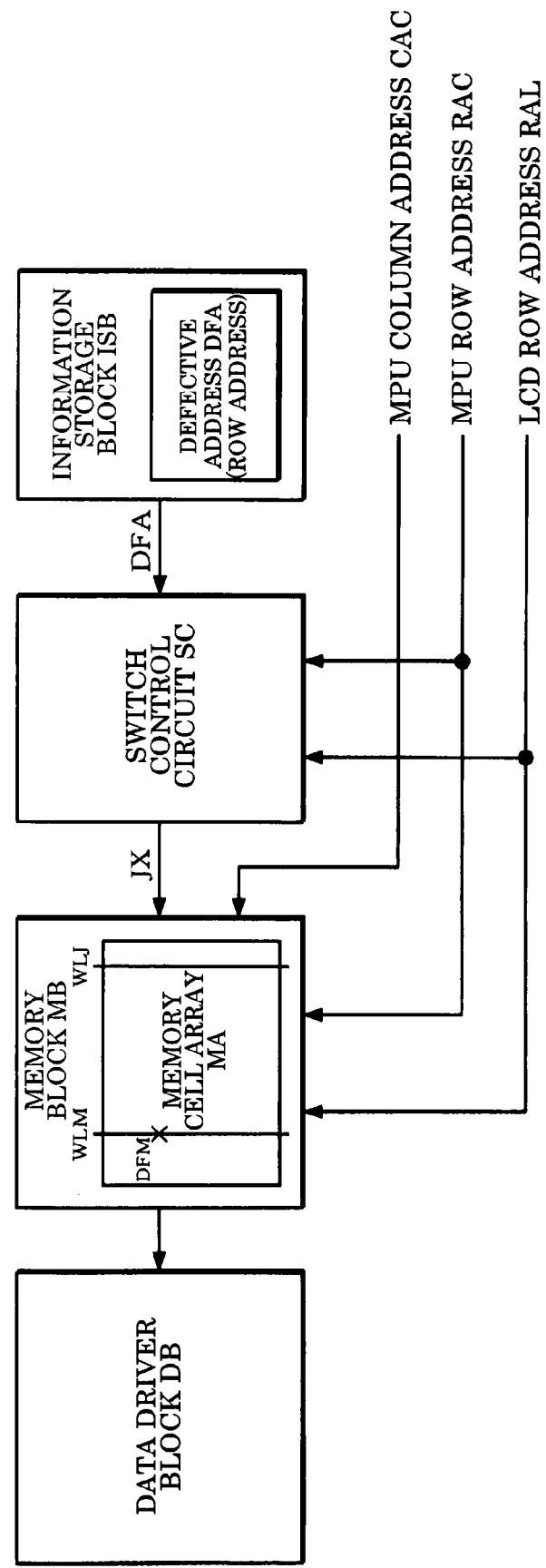
FIG. 1 shows a configuration example of an integrated circuit device according to one embodiment of the invention.

Aspects of the invention provide an integrated circuit device which can improve the yield while minimizing an increase in area, and an electronic instrument including the same.

According to one embodiment of the invention, there is provided an integrated circuit device comprising:

at least one data driver block for driving data lines;

at least one memory block which includes memory cells and redundant cells for repairing a defective cell and stores image data supplied to the data driver block;

an information storage block in which an address of the defective cell of the memory block is programmed and stored as a defective address; and a switch control circuit which performs control for switching access to the defective cell to access to the redundant cell;

a row address of the defective cell having the row address and a column address being stored in the information storage block as the defective address; and the switch control circuit performing control for switching access to the defective cell to access to the redundant cell by comparing a row address for display panel access with the defective address stored in the information storage block during the display panel access which is access for a display operation of a display panel, and comparing a row address for host access, which uses the row address and a column address, with the defective address stored in the information storage block during the host access which is access from a host to the memory block.

According to this embodiment, the row address of the defective cell is stored in the information storage block as the defective address. The redundant cell switch control is achieved by comparing the row address for the display panel access with the defective address during the display panel access and comparing the row address for the host access with the defective address during the host access. As described above, this embodiment focuses on the peculiarity of the display panel access and limits the address programmed in the information storage block to the row address of the defective cell. This makes it possible to reduce the scale of the information storage block and the switch control circuit, whereby the yield can be improved while minimizing an increase in the area of the integrated circuit device. Moreover, the programming time of the information storage block and the like can be reduced.

In the integrated circuit device according to this embodiment, the memory block may include:

a memory cell array in which memory cells and redundant cells are disposed;

a row address decoder which decodes a row address and selects a wordline of the memory cell array; and a column address decoder which decodes a column address and selects a bitline of the memory cell array.

This achieves display panel access and host access optimum for the display operation of the display panel.

In the integrated circuit device according to this embodiment, the row address for the display panel access may be input to the row address decoder during the display panel access; and the row address for the host access may be input to the row address decoder and the column address for the host access may be input to the column address decoder during the host access.

According to this configuration, the redundant cell switch control can be achieved utilizing the row address input to the row address decoder during the display panel access or the host access.

In this embodiment, the switch control circuit may output a switching signal for switching access to the defective cell to access to the redundant cell to the row address decoder, and the row address decoder may select the wordline of the redundant cells when the switching signal from the switch control circuit is active during the display panel access or the host access.

According to this configuration, the defective cell can be switched to the redundant cell by simple control utilizing the switching signal from the switch control circuit.

The integrated circuit device according to this embodiment may comprise:

first to Ith memory blocks (I is an integer equal to or larger than two), each of the first to Ith memory blocks including memory cells and redundant cells for repairing a defective cell;

wherein the first to Ith memory blocks respectively may include first to Ith row address decoders; and wherein, when a defective cell exists in the Kth memory block ($1 \leq K \leq I$) of the first to Ith memory blocks, not only the Kth row address decoder but also the row address decoders other than the Kth row address decoder may select wordlines of the redundant cells during the display panel access.

According to this configuration, the wordline selection control during the redundant cell switching process can be simplified during the display panel access.

In the integrated circuit device according to this embodiment, first to Ith bank signals for selecting the first to Ith memory blocks may be respectively input to the first to Ith row address decoders; and when the Lth bank signal ($1 \leq L \leq I$) has become active and the Lth memory block has been selected during the host access, the Lth row address decoder may select a wordline of the redundant cells, and the row address decoders other than the Lth row address decoder may not select wordlines of the memory cells and the redundant cells.

According to this configuration, the image data which should be written into the memory cell of the wordline corresponding to the defective cell can be correctly written into the redundant cell and the wordline selection control during the redundant cell switching process can be simplified during the host access.

In the integrated circuit device according to this embodiment, the switch control circuit may include: a first coincidence detection circuit which receives the row address for the display panel access and the defective address from the information storage block, detects whether or not the row address for the display panel access coincides with the defective address, and activates a first switching signal when the row address for the display panel access coincides with the defective address; and a second coincidence detection circuit which receives the row address for the host access and the defective address from the information storage block, detects whether or not the row address for the host access coincides with the defective address, and activates a second switching signal when the row address for the host access coincides with the defective address.

According to this configuration, the redundant cell switching process can be simply achieved utilizing the first and second switching signals from the first and second coincidence detection circuits.

In the integrated circuit device according to this embodiment, use instruction information which indicates whether or not to use the redundant cells may be programmed and stored in the information storage block;

the first coincidence detection circuit may receive an instruction signal corresponding to the use instruction information stored in the information storage block, and may inactivate the first switching signal when the instruction signal indicates that the redundant cells are not used; and the second coincidence detection circuit may receive the instruction signal, and may inactivate the second switching signal when the instruction signal indicates that the redundant cells are not used.

This makes it possible to program whether or not to perform the redundant cell switch control in the information storage block, whereby convenience can be increased.

According to another embodiment of the invention, there is provided an integrated circuit device comprising:

at least one data driver block for driving data lines;

at least one memory block which includes memory cells and redundant cells for repairing a defective cell and stores image data supplied to the data driver block;

an information storage block in which an address of the defective cell of the memory block is programmed and stored as a defective address; and a switch control circuit which performs control for switching access to the defective cell to access to the redundant cell;

a first address of the defective cell, which has an address made up of the first address and a second address, being stored in the information storage block as the defective address; and the switch control circuit performing control for switching access to the defective cell to access to the redundant cell by comparing a first address for display panel access with the defective address stored in the information storage block during the display panel access which is access for a display operation of a display panel and comparing a first address for host access, which uses an address made up of the first address and a second address, with the defective address stored in the information storage block during the host access which is access from a host to the memory block.

According to this embodiment, the first address of the defective cell is stored in the information storage block as the defective address. The redundant cell switch control is achieved by comparing the first address for the display panel access with the defective address during the display panel access and comparing the first address for the host access with the defective address during the host access. This makes it possible to reduce the scale of the information storage block and the switch control circuit, whereby the yield can be improved while minimizing an increase in the area of the integrated circuit device. Moreover, the programming time of the information storage block and the like can be reduced.

The integrated circuit device according to this embodiment may comprise:

first to Nth circuit blocks (N is an integer equal to or larger than two) disposed along a first direction when a direction from a first side which is a short side of the integrated circuit device toward a third side opposite to the first side is defined as a first direction and a direction from a second side which is a long side of the integrated circuit device toward a fourth side opposite to the second side is defined as a second direction;

wherein the first to Nth circuit blocks may include at least one data driver block and at least one memory block.

According to this configuration, since the first to Nth circuit blocks are disposed along the first direction, the width of the integrated circuit device in the second direction can be reduced, whereby a narrow integrated circuit device can be provided.

In the integrated circuit device according to this embodiment, image data stored in the memory block may be read from the memory block into the data driver block RN times ($RN \geq 2$) in one horizontal scan period, and the redundant cells of at least RN wordlines may be provided in the memory block.

The number of memory cells of the memory block in the second direction can be reduced by reading the image data RN times in one horizontal scan period, whereby the width of the memory block in the second direction can be reduced. It is possible to appropriately control switching from the defective cell to the redundant cell by providing the redundant cells of at least RN wordlines, even when employing the method of reading the image data two or more times in one horizontal period.

According to a further embodiment of the invention, there is provided an integrated circuit device comprising:

first to Nth circuit blocks (N is an integer equal to or larger than two) disposed along a first direction when a direction from a first side which is a short side of the integrated circuit device toward a third side opposite to the first side is defined as a first direction and a direction from a second side which is a long side of the integrated circuit device toward a fourth side opposite to the second side is defined as a second direction; and an information storage block in which initial adjustment information for performing an initial adjustment of the circuit block of the integrated circuit device is programmed and stored;

the first to Nth circuit blocks including:

at least one data driver block for driving data lines; and a logic circuit block which controls the data driver block, the logic circuit block being disposed between the data driver block and the information storage block.

According to this embodiment, since the first to Nth circuit blocks are disposed along the first direction, the width of the integrated circuit device in the second direction can be reduced, whereby the area of the integrated circuit device can be reduced. According to this embodiment, the initial adjustment information of the circuit block of the integrated circuit device is programmed and stored in the information storage block. Therefore, the integrated circuit device can be optimally operated using the initial adjustment information. According to this embodiment, the logic circuit block is disposed between the data driver block and the information storage block. Therefore, signal lines provided in the region opposite to the information storage block with respect to the logic circuit block do not overlap signal lines provided between the logic circuit block and the information storage block. This ensures that the signal line wiring region is sufficiently provided, whereby the wiring efficiency can be improved. As a result, the area of the integrated circuit device can be reduced.

In the integrated circuit device according to this embodiment, the information storage block may be disposed adjacent to the logic circuit block.

According to a further embodiment of the invention, there is provided an integrated circuit device comprising:

first to Nth circuit blocks (N is an integer equal to or larger than two) disposed along a first direction when a direction from a first side which is a short side of the integrated circuit device toward a third side opposite to the first side is defined as a first direction and a direction from a second side which is a long side of the integrated circuit device toward a fourth side opposite to the second side is defined as a second direction; and an information storage block in which initial adjustment information for performing an initial adjustment of the circuit block of the integrated circuit device is programmed and stored;

the first to Nth circuit blocks including: at least one data driver block for driving data lines; and a logic circuit block which controls the data driver block; and the information storage block being disposed adjacent to the logic circuit block.

According to this embodiment, since the first to Nth circuit blocks are disposed along the first direction, the width of the integrated circuit device in the second direction can be reduced, whereby the area of the integrated circuit device can be reduced. According to this embodiment, the initial adjustment information of the circuit block of the integrated circuit device is programmed and stored in the information storage block. Therefore, the integrated circuit device can be optimally operated using the initial adjustment information. According to this embodiment, the logic circuit block is disposed adjacent to the information storage block. This enables the logic circuit block and the information storage block to be connected through a signal line along a short path, whereby the wiring efficiency can be improved. As a result, the area of the integrated circuit device can be reduced.

In the integrated circuit device according to this embodiment, the first to Nth circuit blocks may include at least one scan driver block for driving scan lines; and when a direction opposite to the second direction is defined as a fourth direction, the information storage block may be disposed on the fourth direction side of the scan driver block.

According to this configuration, since the information storage block can be disposed in the region in which the signal lines can be additionally provided, an increase in chip area due to the wiring region can be minimized.

The integrated circuit device according to this embodiment may comprise an oscillation circuit block for generating a clock signal of the integrated circuit device; wherein adjustment information of an oscillation frequency of the oscillation circuit block may be programmed and stored in the information storage block as the initial adjustment information; and wherein the oscillation circuit block may be disposed between the scan driver block and the information storage block.

This enables the adjustment information signal line to be provided between the oscillation circuit block and the information storage block along a short path, whereby an increase in chip area due to the wiring region can be prevented.

In the integrated circuit device according to this embodiment, first to mth storage blocks (m is an integer equal to or larger than two) in which first to mth initial adjustment information may be respectively programmed and stored are disposed in the information storage block.

Programming in the initial adjustment information programming step can be simplified by collectively disposing the first to mth storage blocks in one location.

In this embodiment, at least two of a first storage block in which the address of the defective cell of the memory block is programmed and stored as the initial adjustment information, a second storage block in which the adjustment information of the oscillation frequency of the oscillation circuit block is programmed and stored as the initial adjustment information, and a third storage block in which the adjustment information of the reference voltage generated by the reference voltage generation circuit is programmed and stored as the initial adjustment information may be disposed in the information storage block.

Note that the storage block disposed in the information storage block is not limited to the first to third storage blocks.

In the integrated circuit device according to this embodiment, the first to Nth circuit blocks may include at least one memory block which includes memory cells and redundant cells for repairing a defective cell and stores image data supplied to the data driver block; and an address of the defective cell of the memory block may be programmed and stored in the information storage block as the initial adjustment information.

This reduces a decrease in yield caused by the presence of the defective cell.

According to a further embodiment of the invention, there is provided an electronic instrument comprising:

the above integrated circuit device; and a display panel driven by the integrated circuit device.

Preferred embodiments of the invention are described below in detail. Note that the embodiments described below do not in any way limit the scope of the invention defined by the claims laid out herein. Note that all elements of the embodiments described below should not necessarily be taken as essential requirements for the invention.

1. Redundant Cell Switch Control 1.1 Storage of Row Address of Defective Cell

FIG. 1 shows a circuit configuration example of an integrated circuit device (display driver) according to this embodiment. The integrated circuit device according to this embodiment includes a data driver block DB, a memory block MB, a switch control circuit SC, and an information storage block ISB. The integrated circuit device according to this embodiment is not limited to the configuration shown in FIG. 1. Various modification may be made such as omitting some of the elements or adding other elements.

The data driver block DB is a circuit for driving data lines of a display panel such as a liquid crystal display (LCD). The memory block MB stores image data supplied to the data driver block DB. In FIG. 1, one data driver block DB and one memory block MB are provided. Note that two or more data driver blocks DB and two or more memory blocks MB may be provided.

A memory cell array MA of the memory block MB includes memory cells and redundant cells (redundant memory cells or redundant bits) for repairing a defective cell DFM. In FIG. 1, a defective cell DFM exists corresponding to a wordline WLM (Mth wordline; M is a positive integer), for example. Specifically, the memory cell connected with the wordline WLM is the defective cell. In FIG. 1, redundant cells are provided corresponding to a wordline WLJ (Jth wordline; J is a positive integer). Specifically, the memory cells connected with the wordline WLJ are the redundant cells. When the defective cell DFM shown in FIG. 1 has occurred due to a problem in the manufacturing process or the like, the yield can be improved by replacing the defective cell DFM with a spare redundant cell.

The address of the defective cell DFM of the memory block MB is programmed and stored in the information storage block ISB as a defective address DFA. Specifically, when a defective cell is detected using a tester during the production of the integrated circuit device, the defective address DFA is stored in a storage device of the tester or the like. The stored defective address DFA is programmed and stored in the information storage block ISB.

A fuse block may be used as the information storage block ISB, for example. Fuse elements are provided in the fuse block. The defective address DFA is programmed by the blown or not-blown state of the fuse element. Specifically, the defective address DFA is programmed by blowing or not blowing the fuse element based on the defective address DFA obtained by inspection during the production of the integrated circuit device. As the fuse element, an element may be employed which is blown (fused) by applying a laser beam or a high voltage, for example. It suffices that initial adjustment information for performing an initial adjustment of the circuit block of the integrated circuit device be programmed and stored in the information storage block ISB. A storage block other than the fuse block may also be employed as the information storage block ISB.

The switch control circuit SC performs control for switching access to the defective cell DFM (access to the wordline of the defective cell) to access to the redundant cell (access to the wordline of the redundant cell). Specifically, the switch control circuit SC outputs a switching signal JX for switching access to the defective cell DFM to access to the redundant cell to the memory block MB (row address decoder). For example, when access which selects the wordline WLM of the defective cell DFM has been performed and the switching signal JX has become active, the memory block MB replaces the access which selects the wordline WLM of the defective cell DFM with access which selects the wordline WLJ of the redundant cell. This causes the redundant cell to be selected instead of the defective cell DFM, whereby the yield can be improved.

In this embodiment, the defective cell has a row address (first address in a broad sense) and a column address (second address in a broad sense), and the row address (first address) of the defective cell is programmed and stored in the information storage block ISB as the defective address DFA. Specifically, only the row address (address for selecting the wordline of the defective cell), which is part of the address of the defective cell, is stored instead of the entire address of the defective cell.

The switch control circuit SC receives the defective address DFA stored in the information storage block ISB. When the access is LCD access (display panel access in a broad sense), the switch control circuit SC compares an LCD row address RAL of the LCD access with the defective address DFA stored in the information storage block ISB. The switch control circuit SC detects whether or not the LCD row address RAL coincides with the defective address DFA, for example.

When the access is MPU access (host access in a broad sense), the switch control circuit SC compares a row address RAC (first address) of an MPU row address RAC (first address) and an MPU column address CAC (second address) of the MPU access with the defective address DFA stored in the information storage block ISB. The switch control circuit SC detects whether or not the MPU row address RAC coincides with the defective address DFA, for example. The switch control circuit SC controls switching from the access to the defective cell DFM to the access to the redundant cell depending on the comparison result (coincidence detection result). For example, the switch control circuit SC activates the switching signal JX when the LCD row address RAL or the MPU row address RAC coincides with the defective address DFA.

The term "LCD access (LCD read)" refers to access for the display operation of a display panel such as an LCD. Specifically, the term "LCD access" refers to access for reading image data stored in the memory block MB, supplying the image data to the data driver block DB, and displaying an image on the display panel by causing the data driver block DB to drive the data lines.

The term "MPU access (host access)" refers to access to the memory block MB from a host such as an MPU (CPU, application processor, or baseband engine). The term "MPU access" includes access for writing data of an image displayed on the display panel into the memory block MB, access for reading image data written into the memory block MB into the MPU, and the like.

The operation according to this embodiment is described below with reference to FIGS. 2A and 2B. During the LCD access shown in FIG. 2A, the switch control circuit SC compares the defective address DFA from the information storage block ISB with the LCD row address RAL. The switch control circuit SC activates (asserts) the switching signal JX when the defective address DFA coincides with the LCD row address RAL.

The LCD row address RAL is input to the memory block MB during the LCD access. The memory block MB sequentially selects the wordline corresponding to the LCD row address RAL, and sequentially reads image data from the memory cell corresponding to the selected wordline. The image data read from the memory cell is input to the data driver block DB. The data driver block DB subjects the image data input from the memory block MB to D/A conversion, and drives the data line of the display panel by outputting a data voltage (grayscale voltage) obtained by D/A conversion to the data line.

In this case, when the switching signal JX from the switch control circuit SC has become active, the memory block MB reads the image data from the redundant cell instead of the defective cell DFM. Specifically, the memory block MB selects the wordline WLJ (Jth wordline) of the redundant cell instead of the wordline WLM (Mth wordline) of the defective cell DFM, and reads the image data stored in the redundant cell. The memory block MB (row address decoder) selects the normal wordline corresponding to the LCD row address RAL when the switching signal JX is inactive. On the other hand, when the switching signal JX has become active, the memory block MB selects the wordline WLJ of the redundant cell instead of the wordline WLM corresponding to the LCD row address RAL.

During the MPU access shown in FIG. 2B, the switch control circuit SC compares the defective address DFA from the information storage block ISB with the MPU row address RAC. The switch control circuit SC activates the switching signal JX when the defective address DFA coincides with the MPU row address RAC.

The MPU row address RAC and the MPU column address CAC are input to the memory block MB during the MPU access. The memory block MB selects the wordline corresponding to the MPU row address RAC and the bitline corresponding to the MPU column address CAC. Image data from the MPU (logic circuit) is written into the memory cell corresponding to the selected wordline and the selected bitline. Or, the image data stored in the memory cell corresponding to the selected wordline and the selected bitline is read into the MPU (logic circuit).

In this case, when the switching signal JX from the switch control circuit SC has becomes active, the memory block MB writes the image data into the redundant cell or reads the image data from the redundant cell instead of the defective cell DFM. Specifically, the memory block MB selects the wordline WLJ of the redundant cell instead of the wordline WLM of the defective cell DFM, and writes the image data into the redundant cell or reads the image data from the redundant cell. Specifically, the memory block MB selects the normal wordline corresponding to the MPU row address RAC and selects the bitline corresponding to the MPU column address CAC when the switching signal JX is inactive. On the other hand, when the switching signal JX has become active, the memory block MB selects the wordline WLJ of the redundant cell instead of the wordline corresponding to the MPU row address RAC, and writes the image data into the redundant cell corresponding to the selected wordline WLJ and the selected bitline or reads the image data from this redundant cell.

According to this embodiment, only the row address of the defective cell DFM is stored in the information storage block ISB, and the column address need not be stored in the information storage block ISB. In other words, the address (first address) used in common for the LCD access and the MPU access is stored in the information storage block ISB, and the address (second address) which is not used in common for the LCD access and the MPU access is not stored in the information storage block ISB. Therefore, the amount of information stored in the information storage block ISB is reduced, whereby the scale of the information storage block ISB can be reduced. Since the switch control circuit SC compares only the row address and need not compare the column address, the scale of the switch control circuit SC can also be reduced.

Moreover, it suffices that only the row address be programmed in the information storage block ISB, and the column address need not be programmed in the information storage block ISB. Therefore, the programming time during the production of the integrated circuit device can be reduced, whereby the cost of the integrated circuit device can be reduced. For example, when the information storage block ISB is a fuse block, the number of fuse elements to be blown decreases. Therefore, the time required for the fuse blowing step can be reduced, whereby the manufacturing cost of the integrated circuit device can be reduced.

In particular, this embodiment is characterized by focusing on the fact that the address used in common for the LCD access and the MPU access is the row address and achieving switching from the defective cell to the redundant cell by storing and comparing the row address. Specifically, it is unnecessary to specify the column address during the LCD access in which the display operation of the display panel is performed. On the other hand, the row address and the column address are used during the MPU access. According to this embodiment, the yield is improved while minimizing an increase in the scale of the integrated circuit device and an increase in the programming time by storing and comparing only the row address used in common for the LCD access and the MPU access.

1.2 Memory Block

Figure 3:
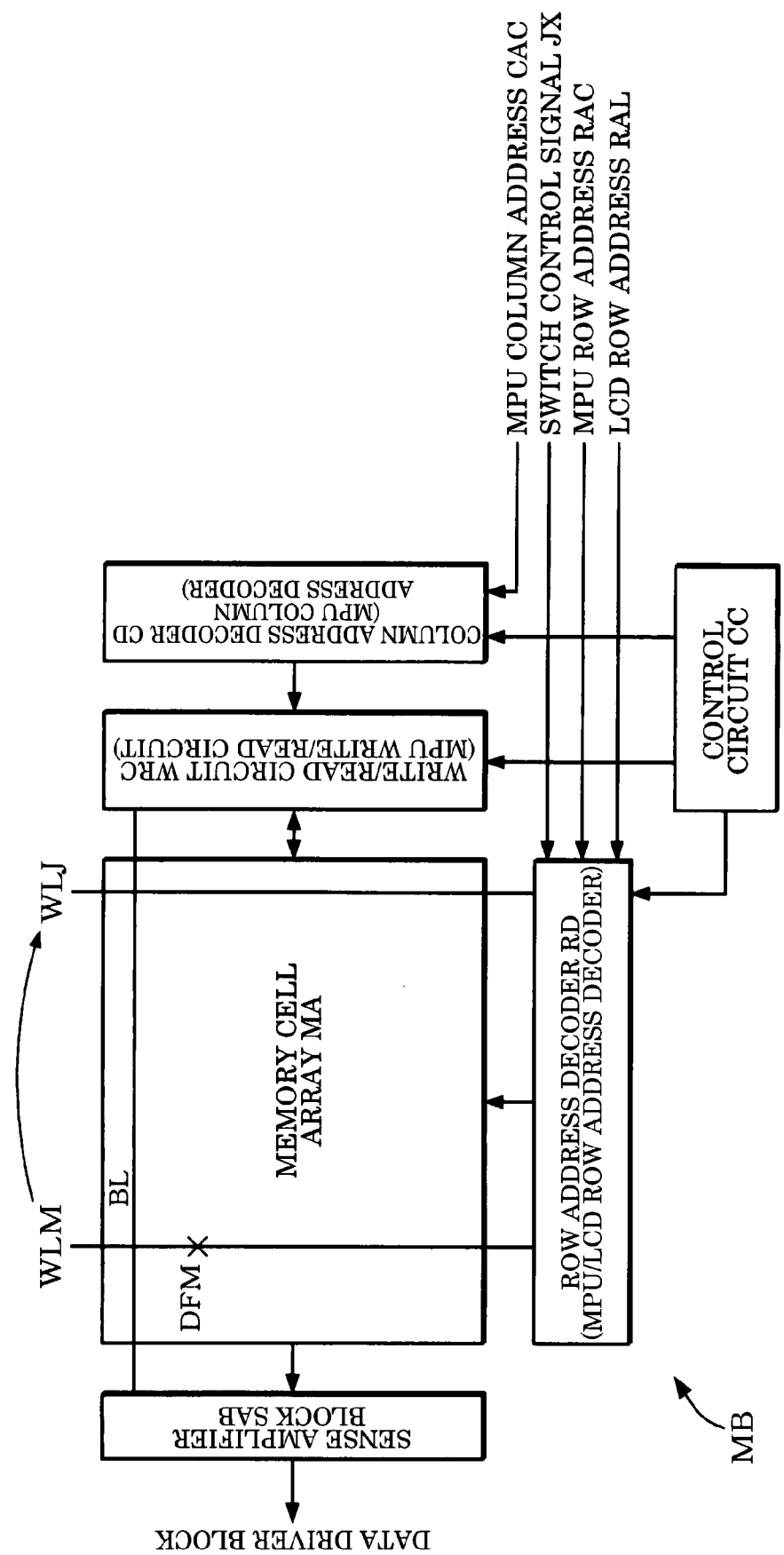
FIG. 3 shows a configuration example of a memory block.

FIG. 3 shows a configuration example of the memory block MB. The memory block MB includes a memory cell array MA, a row address decoder RD, and a column address decoder CD. The memory block MB may also include a sense amplifier block SAB, a write/read circuit WRC, and a control circuit CC.

The memory cell array MA includes memory cells arranged in a matrix. The redundant cells of at least one wordline are disposed in the memory cell array MA.

The row address decoder RD (MPU/LCD row address decoder) decodes the row address, and selects the wordline WL of the memory cell array MA. Specifically, the LCD row address RAL is input to the row address decoder RD during the LCD access (during data driver output). The row address decoder RD decodes the input LCD row address RAL, and selects the wordline. On the other hand, the MPU row address RAC is input to the row address decoder RD during the MPU access which is the access from the host such as an MPU, a CPU, or an image processing controller. The row address decoder RD decodes the input MPU row address RAC, and selects the wordline.

The column address decoder CD (MPU column address decoder) decodes the column address, and selects the bitline BL of the memory cell array. Specifically, the column address decoder CD decodes the MPU column dress CAC and selects the bitline during the MPU access.

The sense amplifier block SAB amplifies the signal of the image data read from the memory cell array MA during the LCD access (during data driver block output), and outputs the image data to the data driver block.

The write/read circuit WRC (MPU write/read circuit) writes the image data into the memory cell (access target memory cell) of the memory cell array MA of which the bitline is selected or reads the image data from the access target memory cell during the MPU access. The write/read circuit WRC may include a sense amplifier for reading the image data. The control circuit CC controls each circuit block in the memory block MB.

The switch control circuit SC shown in FIG. 1 outputs the switching signal JX (JXL, JXC) for switching access to the defective cell DFM to access to the redundant cell to the row address decoder RD shown in FIG. 3. When the switching signal JX from the switch control circuit SC is active during the LCD access or the MPU access, the row address decoder RD selects the wordline WLJ of the redundant cell instead of the wordline WLM of the defective cell DFM.

FIGS. 4A and 4B show signal waveform examples during the LCD access and the MPU access. During the LCD access shown in FIG. 4A, the LCD row address RAL is set, and a signal RLINE (LCD read signal) is then set from the L level to the H level. This causes the LCD read operation to be performed in which image data RDL of one line (one wordline) is read from the memory cell array MA and output to the data driver block, for example.

During the MPU access shown in FIG. 4B, write data WD, a bank signal BANK, the MPU column address CAC, and the MPU row address RAC are set while maintaining a read/write switch signal RXW at the L level. An MPU enable signal CEN is then set from the L level to the H level so that image data WD (e.g. 24-bit data) is written into the memory cell array MA. During the MPU read access, an operation similar to the write operation is performed while maintaining the read/write switch signal RXW at the H level so that the image data RD is read from the memory cell array MA.

1.3 Memory Block Division

Figure 5:
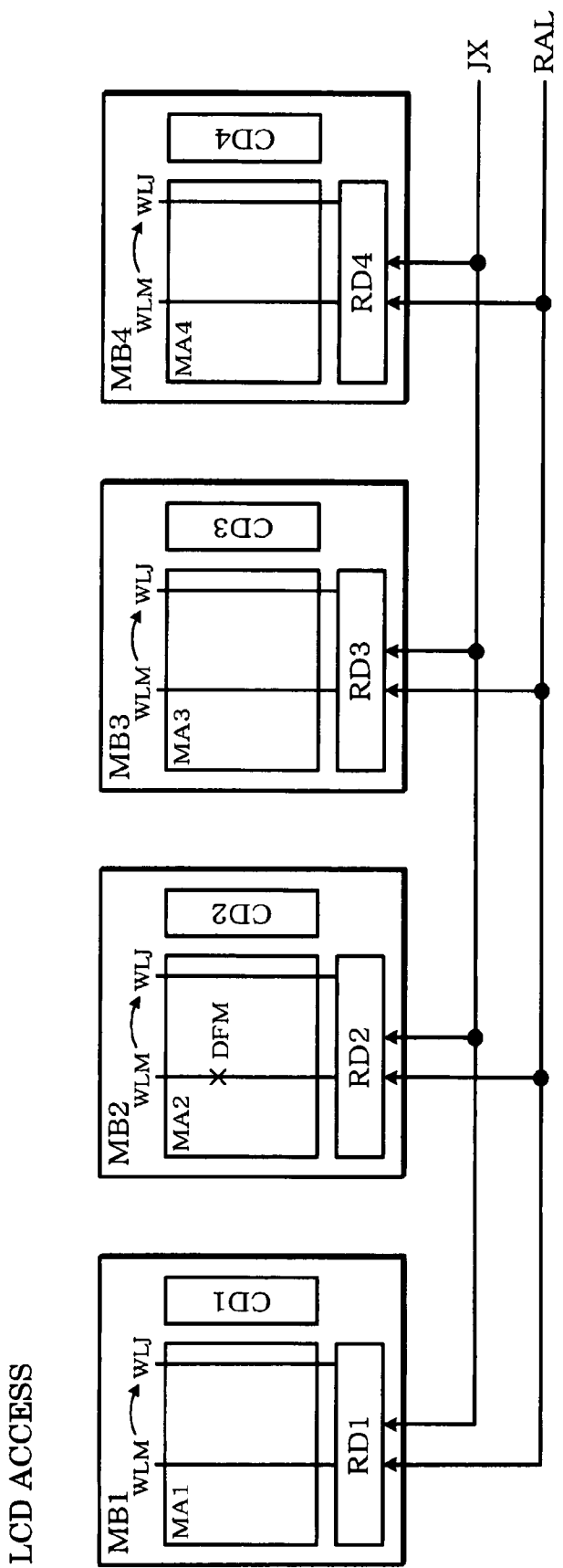
FIG. 5 is a view illustrative of a wordline selection method during LCD access.

In FIG. 5, the memory of the display driver is divided into memory blocks MB1, MB2, MB3, and MB4 (first to Ith memory blocks in a broad sense; I is an integer equal to or larger than two). Each of the memory blocks MB1, MB2, MB3, and MB4 includes memory cells and redundant cells for repairing a defective cell.

The memory blocks MB1 to MB4 respectively include row address decoders RD1 to RD4 (first to Ith row address decoders in a broad sense). The memory blocks MB1 to MB4 respectively include column address decoders CD1 to CD4 and memory cell arrays MA1 to MA4 (first to Ith memory cell arrays in a broad sense). Each of the memory cell arrays MA1 to MA4 includes memory cells and redundant cells of at least one wordline.

In FIG. 5, a defective cell DFM exists in the memory block MB2 (Kth memory block in a broad sense; $1 \leq K \leq I$) of the memory blocks MB1 to MB4 (first to Ith memory blocks). The defective address (row address) of the defective cell DFM is programmed in the information storage block ISB shown in FIG. 1.

In FIG. 5, not only the row address decoder RD2 (Kth row address decoder in a broad sense) of the memory block MB2 in which the defective cell DFM exists, but also the row address decoders RD1, RD3, and RD4 select the wordlines WLJ of the redundant cells during the LCD access (during LCD read). Specifically, when the LCD row address RAL corresponding to the defective address has been input and the switching signal JX has become active, not only the row address decoder RD2, but also the row address decoders RD1, RD3, and RD4 select the wordlines WLJ of the redundant cells.

According to this configuration, the wordlines WLJ of the redundant cells are selected in all of the memory blocks MB1 to MB4 when switching from the defective cell to the redundant cell, whereby the wordline selection control during the redundant cell switching process can be simplified.

FIGS. 6A and 6B are views illustrative of the operation of the memory blocks MB1 to MB4 during the MPU access. Bank signals BANK1, BANK2, BANK3, and BANK4 for selecting the memory blocks (first to Ith bank signals in a broad sense; the bank signals BANK3 and BANK4 are not shown) are respectively input to the row address decoders RD1 to RD4 of the memory blocks MB1 to MB4.

In FIG. 6A, the bank signal BANK1 (Lth bank signal in a broad sense; $1 \leq L \leq I$) has become active during the host access so that the memory block MB1 (Lth memory block in a broad sense) has been selected. In this case, the row address decoder RD1 (Lth row address decoder) selects the wordline WLJ of the redundant cells. Specifically, when the MPU row address RAC corresponding to the defective address has been input and the switching signal JX has become active, the row address decoder RD1 selects the wordlines WLJ of the redundant cells. The column address decoder CD1 selects the bitline BL corresponding to the MPU column address CAC.

In this case, the row address decoders RD2, RD3, and RD4 other than the row address decoder RD1 do not select the wordlines of the memory cells and the redundant cells. Specifically, while all of the row address decoders RD1 to RD4 select the wordlines WLJ during the LCD access shown in FIG. 5, only the row address decoder RD1 of the memory block MB1 selected when the bank signal BANK1 has become active selects the wordline in FIG. 6A.

In FIG. 6B, the bank signal BANK2 (Lth bank signal) has become active during the host access so that the memory block MB2 (Lth memory block) has been selected. In this case, the row address decoder RD2 (Lth row address decoder) selects the wordline WLJ of the redundant cells. Specifically, when the MPU row address RAC corresponding to the defective address has been input and the switching signal JX has become active, the row address decoder RD2 selects the wordlines WLJ of the redundant cells. The column address decoder CD2 selects the bitline BL corresponding to the MPU column address CAC.

In this case, the row address decoders RD1, RD3, and RD4 other than the row address decoder RD2 do not select the wordlines of the memory cells and the redundant cells. Specifically, only the row address decoder RD2 of the memory block MB2 selected when the bank signal BANK2 has become active selects the wordline in FIG. 6B in the same manner as in FIG. 6A.

According to the method shown in FIGS. 6A and 6B, when the defective cell DFM exists corresponding to the wordline WLM of the memory block MB2, the image data which should be written into the memory cell of the wordline WLM can be correctly written into the redundant cell of the wordline WLJ in all of the memory blocks MB1 to MB4. Specifically, when the image data is also written into the redundant cell of the wordline WLJ in the memory block MB2 when the memory block MB1 is selected (FIG. 6A), incorrect image data is written during the read operation using the method shown in FIG. 5.

If the image data is written during the MPU access using the method shown in FIGS. 6A and 6B, correct image data can be read from the memory blocks MB1 to MB4 and output to the data driver block even when the wordlines are selected during the LCD access using the method shown in FIG. 5. Therefore, the wordline selection control during the redundant cell switching process can be simplified.

1.4 Information Storage Block and Switch Control Circuit

Figure 7:
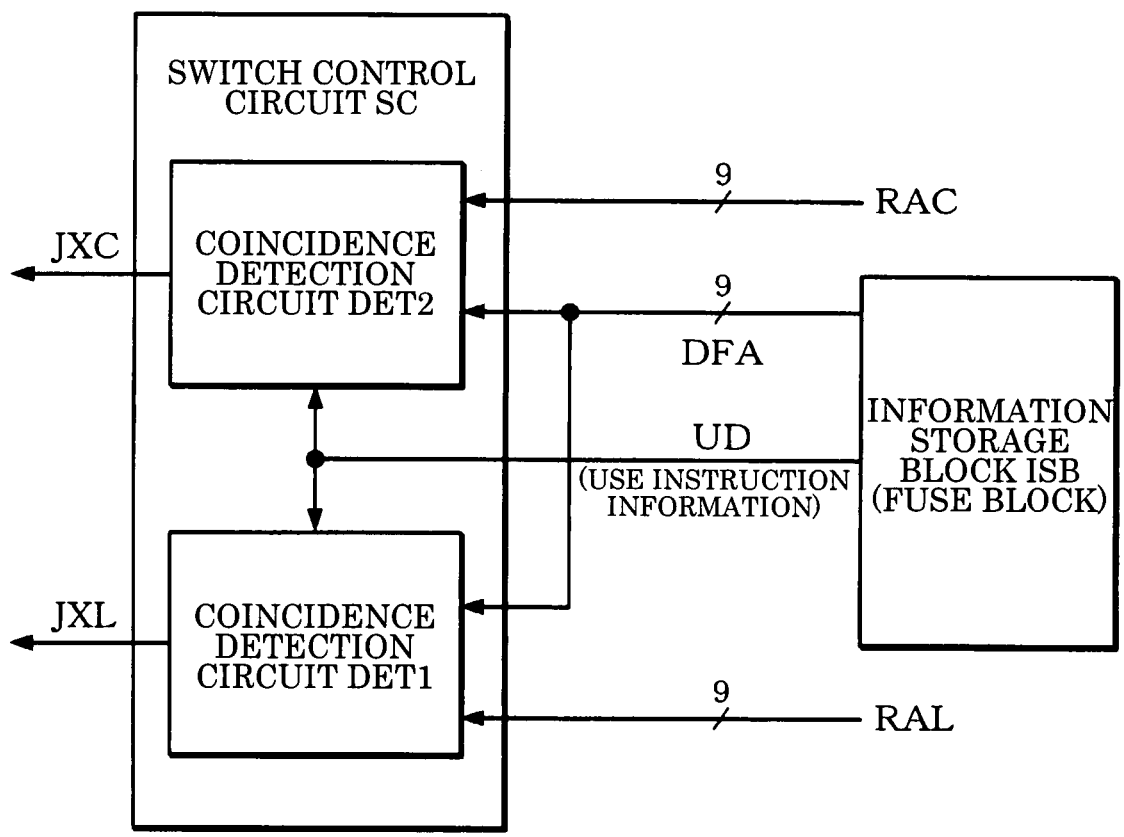
FIG. 7 shows a configuration example of a switch control circuit and an information storage block.
Figure 8:
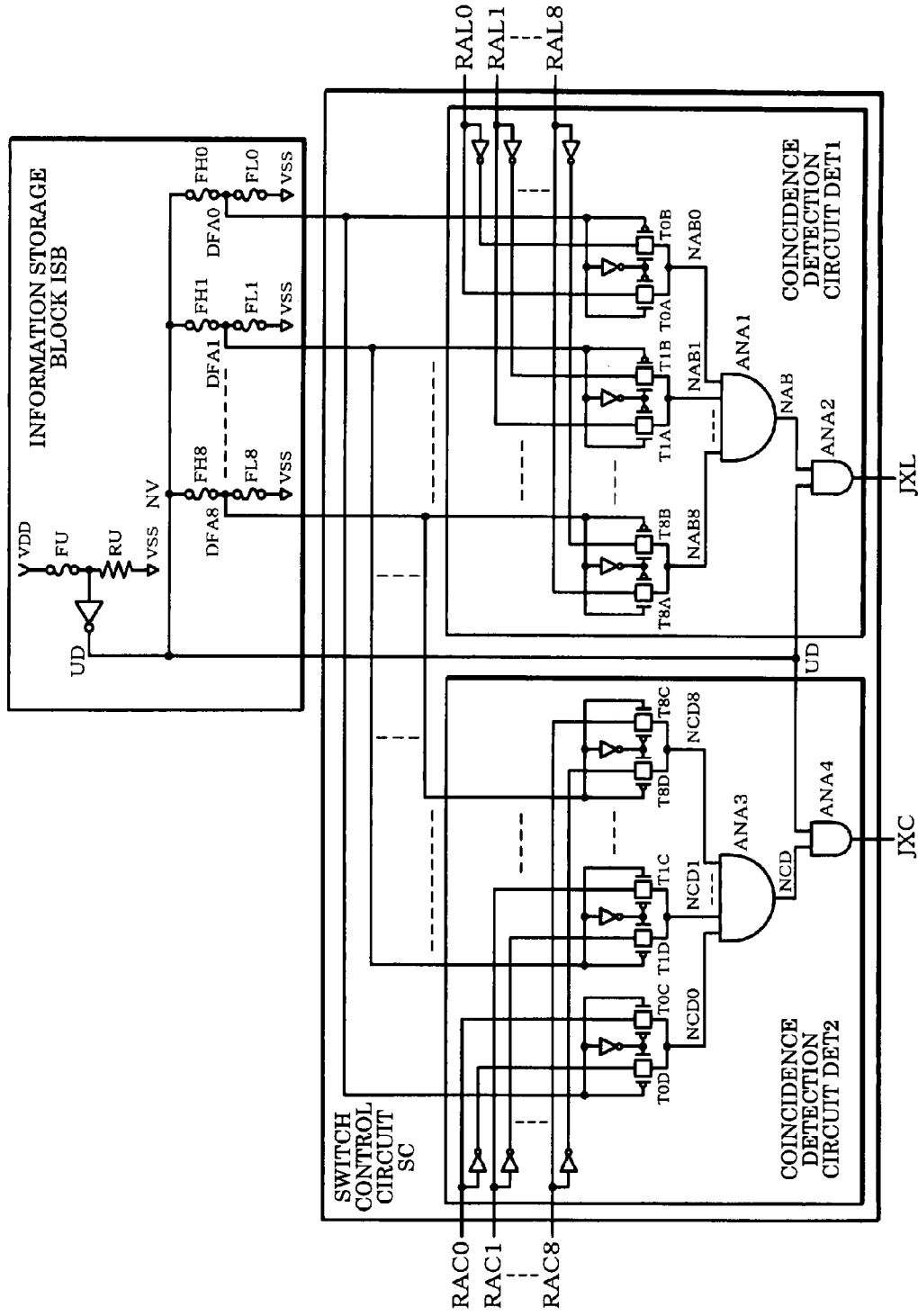
FIG. 8 shows a detailed configuration example of the switch control circuit and the information storage block.

FIGS. 7 and 8 show a configuration example of the information storage block ISB and the switch control circuit SC. The information storage block ISB and the switch control circuit SC are not limited to the configuration shown in FIGS. 7 and 8. Various modification may be made such as omitting some of the elements or adding other elements.

The switch control circuit SC shown in FIG. 7 includes a first coincidence detection circuit DET1 and a second coincidence detection circuit DET2. The coincidence detection circuit DET1 receives the LCD row address RAL and the defective address DFA from the information storage block ISB. The coincidence detection circuit DET1 detects whether or not the LCD row address RAL coincides with the defective address DFA, and activates a first switching signal JXL when the LCD row address RAL coincides with the defective address DFA.

The coincidence detection circuit DET2 receives the MPU row address RAC and the defective address DFA from the information storage block ISB. The coincidence detection circuit DET2 detects whether or not the MPU row address RAC coincides with the defective address DFA, and activates a second switching signal JXC when the MPU row address RAC coincides with the defective address DFA.

FIG. 7 shows an example in which the LCD row address RAL, the MPU row address RAC, and the defective address DFA are 9 bits. Note that the number of bits of these addresses is arbitrary.

In FIG. 7, use instruction information which indicates whether or not to use the redundant cell (redundant cell switch control) is programmed and stored in the information storage block ISB. The coincidence detection circuit DET1 receives an instruction signal UD corresponding to the use instruction information stored in the information storage block ISB, and inactivates the switching signal JXL when the instruction signal UD indicates that the redundant cells are not used. Specifically, the coincidence detection circuit DET1 sets the switching signal JXL at the inactive level irrespective of whether or not the LCD row address RAL coincides with the defective address DFA.

The coincidence detection circuit DET2 receives the instruction signal UD from the information storage block ISB, and inactivates the switching signal JXC when the instruction signal UD indicates that the redundant cells are not used. Specifically, the coincidence detection circuit DET1 sets the switching signal JXC at the inactive level irrespective of whether or not the MPU row address RAC coincides with the defective address DFA.

It is possible to program whether or not to perform the redundant cell switch control in the information storage block ISB using the instruction signal UD during the production of the integrated circuit device, whereby convenience can be increased.

FIG. 8 shows a detailed configuration example of the information storage block ISB and the switch control circuit SC. The information storage block ISB includes fuse elements FH0 to FH8 and FL0 to FL8 for generating a defective address DFA0 to DFA8. The information storage block ISB also includes a fuse element FU and a high-resistance resistor RU for generating the instruction signal UD. The information storage block ISB may also include a protective element such as a diode in addition to the fuse elements.

When the fuse element FU is blown (fused), a node NV of the instruction signal UD is set at the H level (VDD level). This enables the operations of the coincidence detection circuits DET1 and DET2 and the redundant cell switching process. When the fuse element FU is not blown, the node NV of the instruction signal UD is set at the L level (VSS level). This disables the operations of the coincidence detection circuits DET1 and DET2 and the redundant cell switching process. For example, when the instruction signal UD is set at the L level, the switching signals JXL and JXC which are outputs from AND circuits ANA2 and ANA4 of the coincidence detection circuits DET1 and DET2 are set at the L level (inactive) independent of the coincidence detection results.

The signal level of the defective address DFA0 to DFA8 is set by blowing or not blowing the fuse elements FH0 to FH8 and FL0 to FL8 in a state in which the node NV is set at the H level, whereby the defective address is programmed. For example, the defective address DFA0 to DFA8 is set at the L level by blowing the fuse elements FH0 to FH8. The defective address DFA0 to DFA8 is set at the H level by blowing the fuse elements FL0 to FL8.

The coincidence detection circuit DET1 includes transfer gates (switching elements in a broad sense) T0A to T8A and T0B to T8B and AND circuits ANA1 and ANA2. The transfer gates T0A to T8A are turned ON when the signals of the defective address DFA0 to DFA8 are set at the H level. The transfer gates T0B to T8B are turned ON when the signals of the defective address DFA0 to DFA8 are set at the L level. The signals of the LCD row address RAL0 to RAL8 are input to the sources of the transfer gates T0A to T8A, and the inversion signals of the LCD row address RAL0 to RAL8 are input to the sources of the transfer gates T0B to T8B.

The drains of the transfer gates T0A and T0B are connected with a node NAB0, the drains of the transfer gates T1A and T1B are connected with a node NAB1, and the drains of the transfer gates T8A and T8B are connected with a node NAB8. The nodes NAB0 to NAB8 are connected with the input of the AND circuit ANA1, the output of the AND circuit ANA1 is connected with the input of the AND circuit ANA2, and the AND circuit ANA2 outputs the LCD access switching signal JXL.

The coincidence detection circuit DET2 includes transfer gates T0C to T8C and T0D to T8D and AND circuits ANA3 and ANA4. The transfer gates T0C to T8C are turned ON when the signals of the defective address DFA0 to DFA8 are set at the H level. The transfer gates T0B to T8B are turned ON when the signals of the defective address DFA0 to DFA8 are set at the L level. The signals of the MPU row address RAC0 to RAC8 are input to the sources of the transfer gates T0C to T8C, and the inversion signals of the MPU row address RAC0 to RAC8 are input to the sources of the transfer gates T0D to T8D. The drains of the transfer gates T0C and T0D are connected with a node NCD0, the drains of the transfer gates T1C and T1D are connected with a node NCD1, and the drains of the transfer gates T8C and T8D are connected with a node NCD8. The nodes NCD0 to NCD8 are connected with the input of the AND circuit ANA3, the output of the AND circuit ANA3 is connected with the input of the AND circuit ANA4, and the AND circuit ANA4 outputs the MPU access switching signal JXC.

Suppose that the defective address DFA0 to DFA8 programmed in the information storage block ISB is (10111111)=(HLHHHHHHL), for example. This is achieved by blowing the fuse elements FL0, FH1, FL2 to FL7, and FH8.

When the defective address DFA0 to DFA8 is (HLHHH-HHHL), the transfer gates T0A, T1B, T2A to T7A, and T8B of the coincidence detection circuit DET1 are turned ON. Therefore, when the LCD row address RAL0 to RAL8 is (HLHHHHHHL) which coincides with the defective address DFA0 to DFA8, the nodes NAB0 to NAB8 are set at the H level. This causes the output node NAB of the AND circuit ANA1 to be set at the H level, and the switching signal JXL is set at the H level (active) when the instruction signal UD is set at the H level.

When the defective address DFA0 to DFA8 is (HLHHH-HHHL), the transfer gates T0C, T1D, T2C to T7C, and T8D of the coincidence detection circuit DET2 are turned ON. Therefore, when the MPU row address RAC0 to RAC8 is (HLHHHHHHL) which coincides with the defective address DFA0 to DFA8, the nodes NCD0 to NCD8 are set at the H level. This causes the output node NCD of the AND circuit ANA3 to be set at the H level, and the switching signal JXC is set at the H level (active) when the instruction signal UD is set at the H level.

1.5 Row Address Decoder

Figure 9:
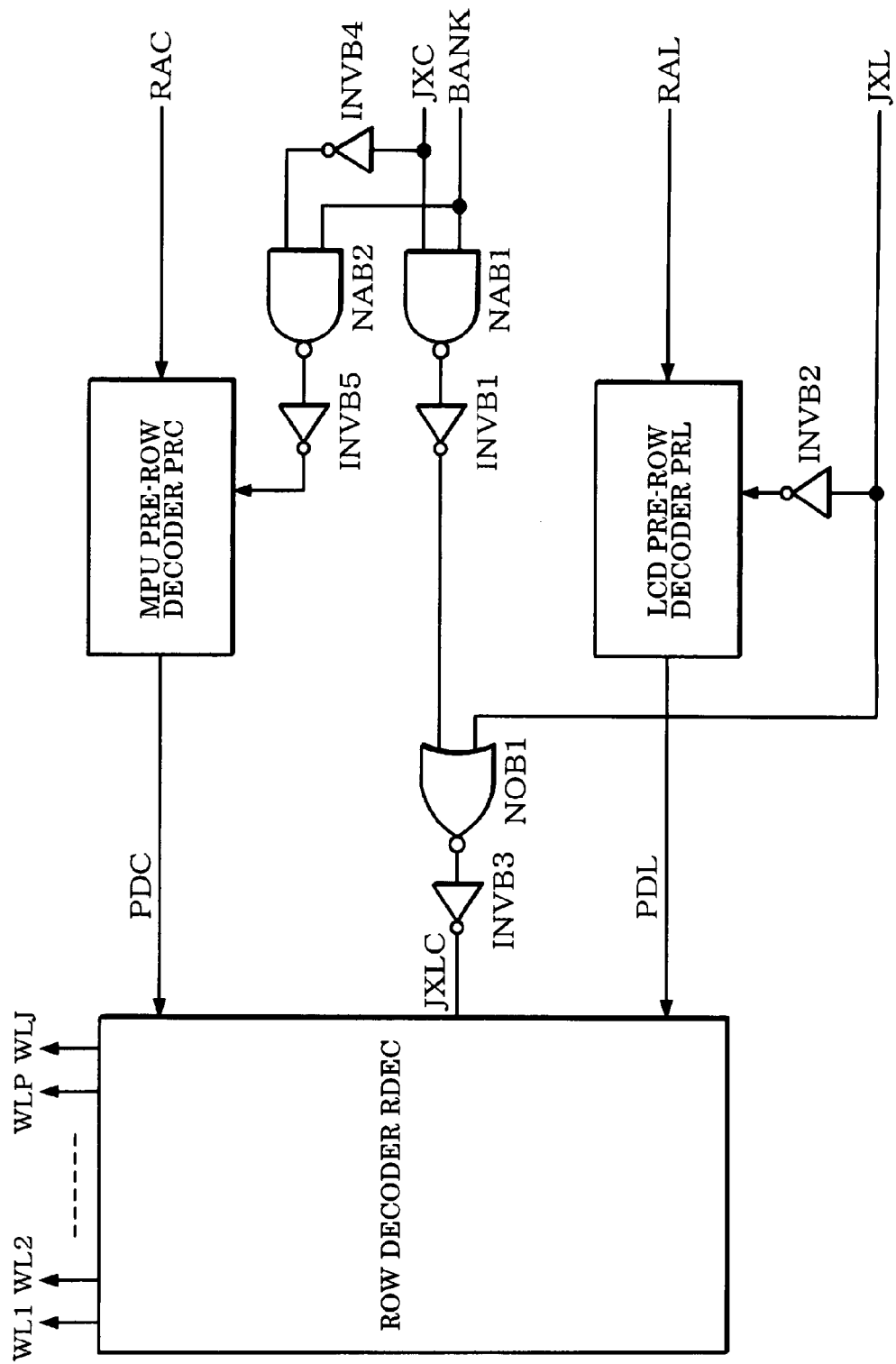
FIG. 9 shows a configuration example of a row address decoder.

FIG. 9 shows a configuration example of the row address decoder RD shown in FIG. 3. The row address decoder RD includes an LCD pre-row decoder PRL, an MPU pre-row decoder PRC, and a row decoder RDEC. The row address decoder RD also includes NAND circuits NAB1 and NAB2, a NOR circuit NOB1, inverter circuits INVB1, INVB2, INVB3, INVB4, and INVB5, and the like.

The LCD pre-row decoder PRL predecodes the received LCD row address RAL, and outputs a predecoding signal PDL to the row decoder RDEC. The MPU pre-row decoder PRC predecodes the received MPU row address RAC, and outputs a predecoding signal PDL to the row decoder RDEC. The row decoder RDEC decodes the received predecoding signals PDL and PDC and a switching signal JXLC, and selects the wordlines WL1 to WLP (first to Pth wordlines) of normal memory cells and the wordline WLJ of the redundant cells.

When the LCD access first switching signal JXL is set at the H level (active) during the LCD access, the predecoding process of the LCD pre-row decoder PRL is disabled. When the switching signal JXL has become active, the switching signal JXLC input to the row decoder RDEC becomes active. When the predecoding process of the LCD pre-row decoder PRL has been disabled and the switching signal JXLC has become active, the row decoder RDEC selects the wordline WLJ of the redundant cells. This realizes the wordline selection method during the LCD access described with reference to FIG. 5.

When the MPU access second switching signal JXC is active (H level) and the memory block selection bank signal BANK is active (H level) during the MPU access, the predecoding process of the MPU pre-row decoder PRC is disabled. The predecoding process of the MPU pre-row decoder PRC is also disabled when the bank signal BANK is inactive (L level). When the switching signal JXC and the bank signal BANK have become active, the switching signal JXLC input to the row decoder RDEC becomes active. When the predecoding process of the MPU pre-row decoder PRC has been disabled and the switching signal JXLC has become active, the row decoder RDEC selects the wordline WLJ of the redundant cells. This realizes the wordline selection method during the MPU access described with reference to FIGS. 6A and 6B.

2. Circuit Configuration Example of Integrated Circuit Device

Figure 10:
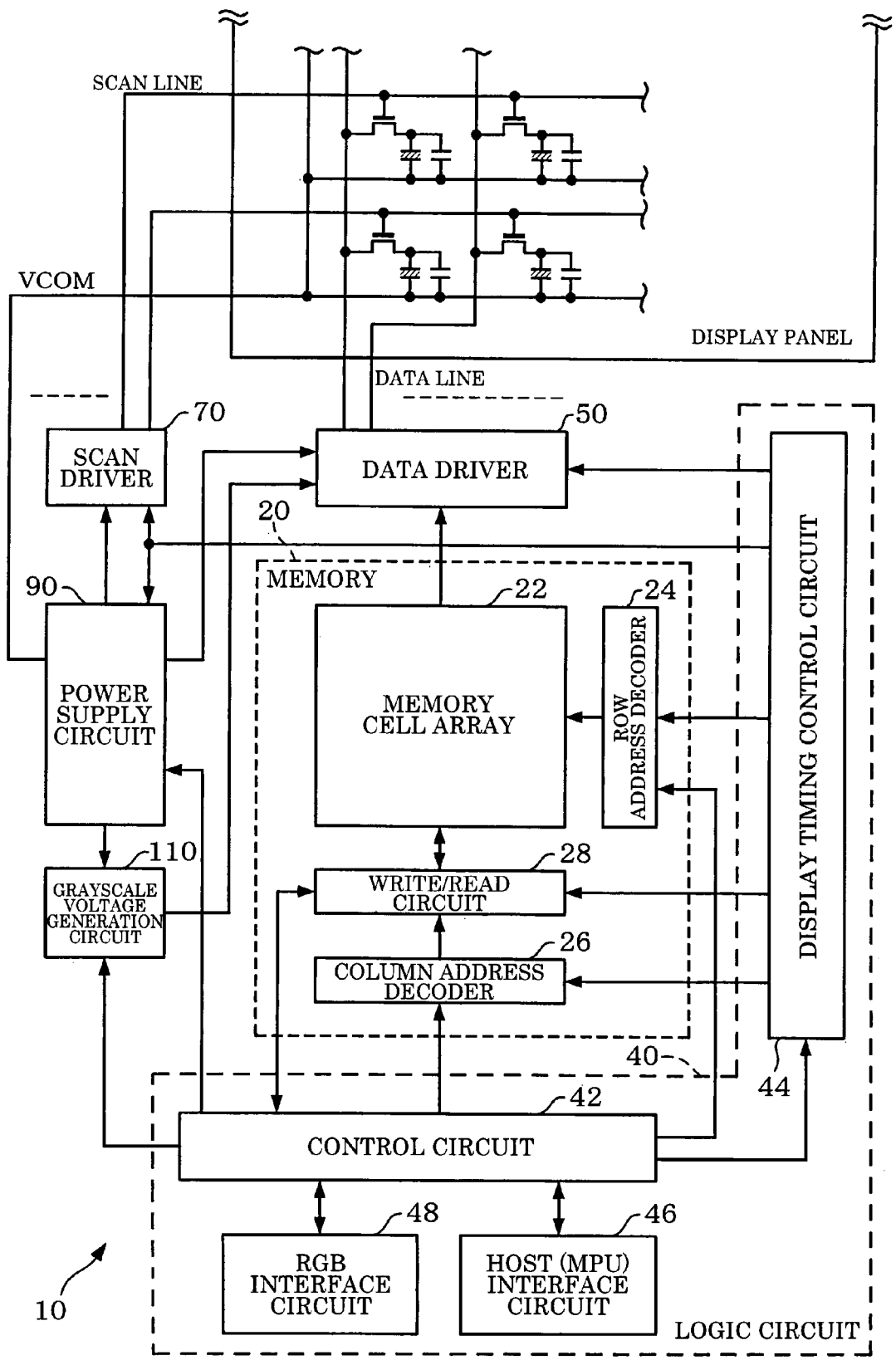
FIG. 10 shows a circuit configuration example of the integrated circuit device.

FIG. 10 shows an example of the circuit configuration of the integrated circuit device (display driver) according to this embodiment. The integrated circuit device according to this embodiment is not limited to the configuration shown in FIG. 10. Various modification may be made such as omitting some of the elements or adding other elements.

A display panel includes data lines (source lines), scan lines (gate lines), and pixels specified by the data lines and the scan lines. The display operation is achieved by changing the optical properties of an electro-optical element (liquid crystal element in a narrow sense) in each pixel region. The display panel may be formed using an active matrix type panel using a switching element such as a TFT or TFD. The display panel may be a panel other than the active matrix type panel, or may be a panel (e.g. organic EL panel) other than the liquid crystal panel.

A memory 20 (display data RAM) stores image data. A memory cell array 22 includes memory cells, and stores image data (display data) of at least one frame (one screen). A row address decoder 24 (MPU/LCD row address decoder) decodes the row address, and selects the wordline of the memory cell array 22. A column address decoder 26 (MPU column address decoder) decodes the column address, and selects the bitline of the memory cell array 22. A write/read circuit 28 (MPU write/read circuit) writes image data into the memory cell array 22 or reads image data from the memory cell array 22.

A logic circuit 40 (driver logic circuit) generates a control signal for controlling the display timing, a control signal for controlling the data processing timing, and the like. The logic circuit 40 may be formed by automatic placement and routing, such as a gate array (G/A).

A control circuit 42 generates various control signals and controls the entire device. Specifically, the control circuit 42 outputs grayscale adjustment data (gamma correction data) for adjusting grayscale characteristics (gamma characteristics) to a grayscale voltage generation circuit 110, and outputs power supply adjustment data for adjusting the power supply voltage to a power supply circuit 90. The control circuit 42 also controls a memory write/read process using the row address decoder 24, the column address decoder 26, and the write/read circuit 28. A display timing control circuit 44 generates various control signals for controlling the display timing, and controls reading of the image data from the memory 20 into the display panel. A host (MPU) interface circuit 46 realizes a host interface for accessing the memory 20 by generating an internal pulse each time accessed from a host. An RGB interface circuit 48 realizes an RGB interface for writing video image RGB data into the memory 20 based on a dot clock signal. The integrated circuit device may be configured to include only one of the host interface circuit 46 and the RGB interface circuit 48.

A data driver 50 is a circuit which generates a data signal for driving the data line of the display panel. Specifically, the data driver 50 receives the image data (grayscale data) from the memory 20, and receives a plurality of (e.g. 256 stages) grayscale voltages (reference voltages) from the grayscale voltage generation circuit 110. The data driver 50 selects the voltage corresponding to the image data from the grayscale voltages, and outputs the selected voltage to the data line of the display panel as the data signal (data voltage).

A scan driver 70 is a circuit which generates a scan signal for driving the scan line of the display panel. Specifically, the scan driver 70 sequentially shifts a signal (enable input/output signal) using a built-in shift register, and outputs a signal obtained by converting the level of the shifted signal to each scan line of the display panel as the scan signal (scan voltage). The scan driver 70 may include a scan address generation circuit and an address decoder. The scan address generation circuit may generate and output a scan address, and the address decoder may decode the scan address to generate the scan signal.

The power supply circuit 90 is a circuit which generates various power supply voltages. Specifically, the power supply circuit 90 increases an input power supply voltage or an internal power supply voltage by a charge-pump method using a boost capacitor and a boost transistor included in a voltage booster circuit provided in the power supply circuit 90. The power supply circuit 90 supplies the resulting voltages to the data driver 50, the scan driver 70, the grayscale voltage generation circuit 110, and the like.

The grayscale voltage generation circuit 110 (gamma correction circuit) is a circuit which generates the grayscale voltage and supplied the grayscale voltage to the data driver 50. Specifically, the grayscale voltage generation circuit 110 may include a ladder resistor circuit which divides the voltage between the high-potential-side power supply and the low-potential-side power supply using resistors and outputs the grayscale voltages to resistance division nodes. The grayscale voltage generation circuit 110 may also include a grayscale register section into which the grayscale adjustment data is written, a grayscale voltage setting circuit which variably sets (controls) the grayscale voltage output to the resistance division node based on the written grayscale adjustment data, and the like.

3. Narrow Integrated Circuit Device

Figure 11:
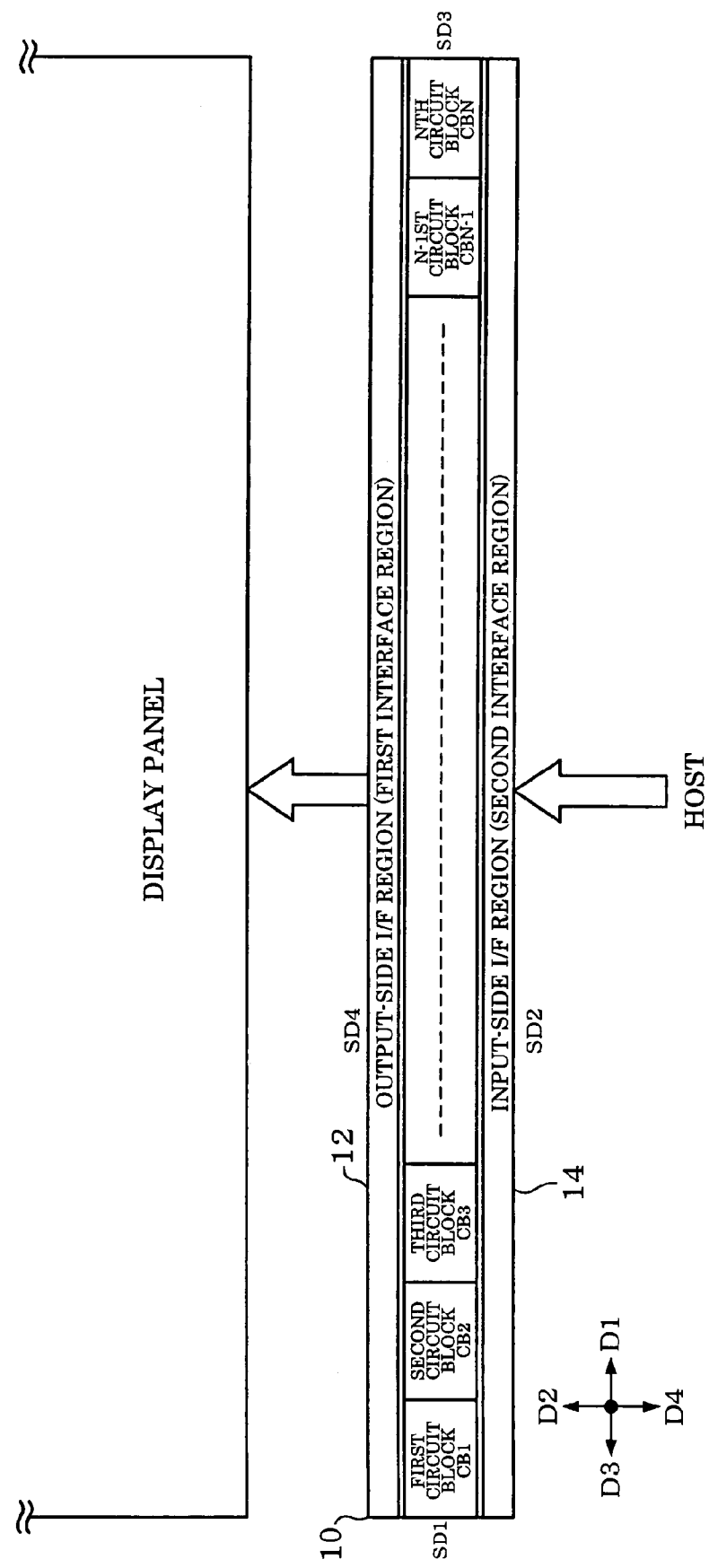
FIG. 11 shows an arrangement configuration example of the integrated circuit device.

FIG. 11 shows an arrangement example of the integrated circuit device 10. In FIG. 11, the direction from a first side SD1 (short side) of the integrated circuit device 10 toward a third side SD3 opposite to the first side SD1 is defined as a first direction D1, and the direction opposite to the first direction D1 is defined as a third direction D3. The direction from a second side SD2 (long side) of the integrated circuit device 10 toward a fourth side SD4 opposite to the second side SD2 is defined as a second direction D2, and the direction opposite to the second direction D2 is defined as a fourth direction D4. In FIG. 11, the left side of the integrated circuit device 10 is the first side SD1, and the right side is the third side SD3. Note that the left side may be the third side SD3, and the right side may be the first side SD1.

The integrated circuit device 10 includes first to Nth circuit blocks CB1 to CBN (N is an integer equal to or larger than two) disposed along the direction D1. The integrated circuit device 10 includes an output-side I/F region 12 (first interface region in a broad sense) provided along the side SD4 on the direction D2 side of the first to Nth circuit blocks CB1 to CBN. The integrated circuit device 10 includes an input-side I/F region 14 (second interface region in a broad sense) provided along the side SD2 on the direction D4 side of the first to Nth circuit blocks CB1 to CBN. Specifically, the output-side I/F region 12 is disposed on the direction D2 side of the circuit blocks CB1 to CBN without another circuit block or the like provided in between, for example. When the integrated circuit device 10 is used as an intellectual property (IP) core and incorporated in another integrated circuit device, at least one of the output-side I/F region 12 and the input-side I/F region 14 (first and second I/O regions) may be omitted from the integrated circuit device 10.

The output-side (display panel side) I/F region 12 is a region which serves as an interface between the integrated circuit device 10 and the display panel, and may include pads and elements connected to the pads, such as output transistors and protective elements. Specifically, the output-side I/F region 12 may include output transistors for outputting the data signals to the data lines and outputting the scan signals to the scan lines, for example. When the display panel is a touch panel or the like, the output-side I/F region 12 may include input transistors.

The input-side (host-side) I/F region 14 is a region which serves as an interface between the integrated circuit device 10 and a host (MPU, image processing controller, or baseband engine), and may include pads and elements connected to the pads, such as input (input/output) transistors, output transistors, and protective elements. Specifically, the input-side I/F region 14 may include input transistors for inputting signals (digital signals) from the host, output transistors for outputting signals to the host, and the like.

An output-side region or an input-side I/F region may be provided along the short side SD1 or SD3. A bump which serves as an external connection terminal or the like may be provided in the I/F (interface) regions 12 and 14, or may be provided in a region (first to Nth circuit blocks CB1 to CBN) other than the I/F (interface) regions 12 and 14. When providing the bump in the region other than the I/F regions 12 and 14, the bump is formed using a small bump technology (e.g. bump technology using a resin core) other than a gold bump technology.

The first to Nth circuit blocks CB1 to CBN may include at least two (or three) different circuit blocks (circuit blocks having different functions). For example, when the integrated circuit device 10 is a display driver, the circuit blocks CB1 to CBN may include at least two of a data driver block, a memory block, a scan driver block, a logic circuit block, a grayscale voltage generation circuit block, and a power supply circuit block. Specifically, the circuit blocks CB1 to CBN may include at least a data driver block and a logic circuit block, and may further include a grayscale voltage generation circuit block. When the integrated circuit device 10 includes a built-in memory, the circuit blocks CB1 to CBN may include a memory block.

Figure 12A:
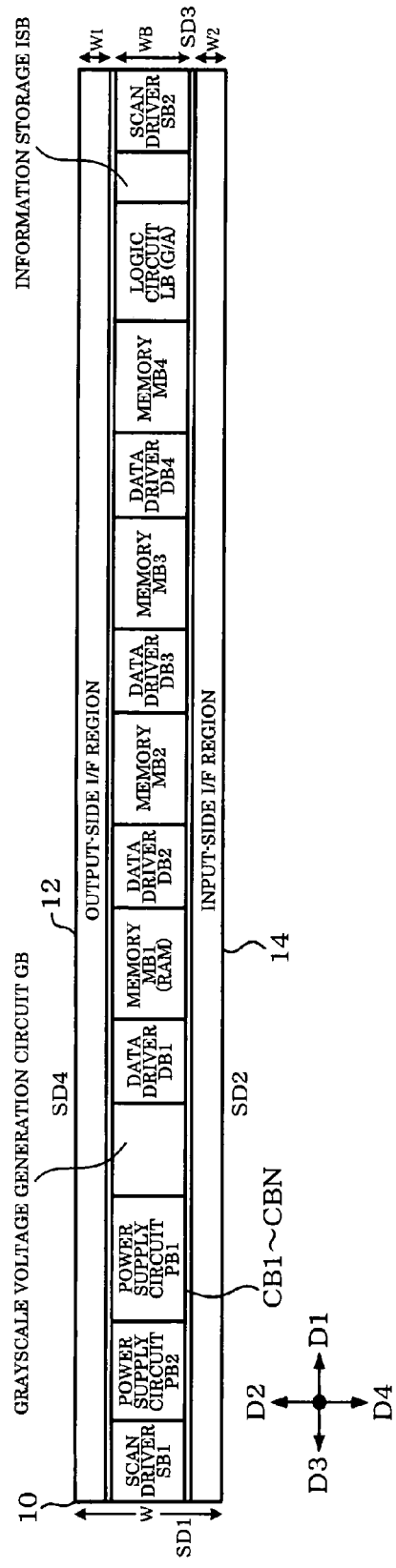
FIGS. 12A and 12B show planar layout examples of the integrated circuit device.
Figure 12B:
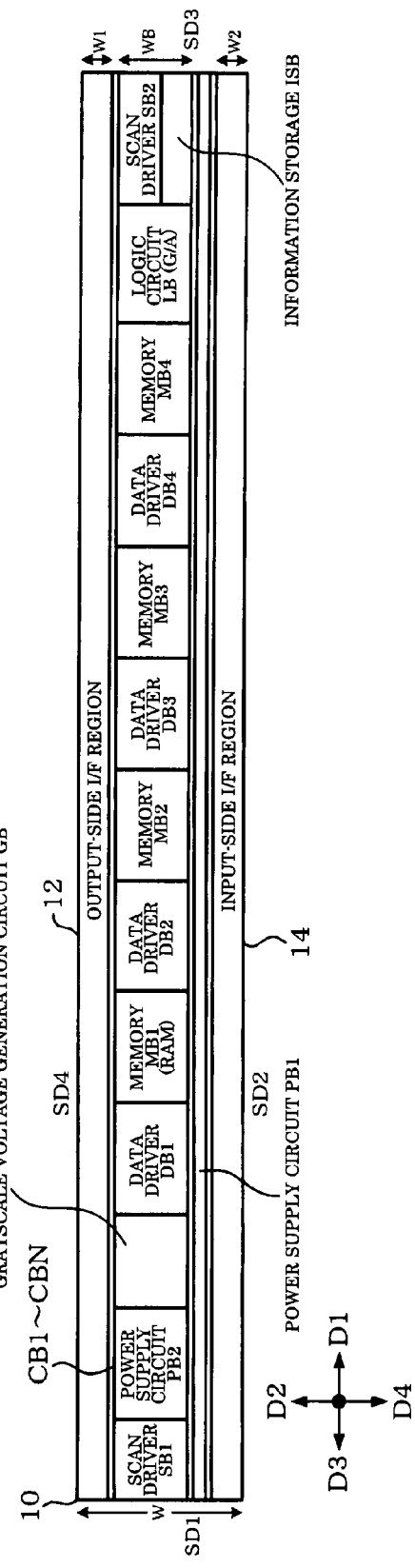

FIGS. 12A and 12B show detailed examples of the planar layout of the integrated circuit device 10. In FIGS. 12A and 12B, the first to Nth circuit blocks CB1 to CBN include first to fourth memory blocks MB1 to MB4 (first to Ith memory blocks in a broad sense; I is an integer equal to or larger than two). The first to Nth circuit blocks CB1 to CBN include first to fourth data driver blocks DB1 to DB4 (first to Ith data driver blocks in a broad sense) respectively disposed adjacent to the first to fourth memory blocks MB1 to MB4 along the direction D1. Specifically, the memory block MB1 and the data driver block DB1 are adjacently disposed along the direction D1, and the memory block MB2 and the data driver block DB2 are adjacently disposed along the direction D1. The memory block MB1 adjacent to the data driver block DB1 stores image data (display data) for the data driver block DB1 to drive the data line, and the memory block MB2 adjacent to the data driver block DB2 stores image data for the data driver block DB2 to drive the data line.

In FIGS. 12A and 12B, scan driver blocks SB1 and SB2 are disposed on either end of the integrated circuit device 10. A modification is also possible in which only one of the scan driver blocks SB1 and SB2 is provided or the scan driver blocks SB1 and SB2 are not provided.

In FIG. 12A, the data driver blocks DB1 to DB4 (memory blocks MB1 to MB4) are disposed between the grayscale voltage generation circuit block GB and the logic circuit block LB. The grayscale voltage generation circuit block GB is disposed between the power supply circuit block PB2 (PB1) and the data driver blocks DB1 to DB4 (memory blocks MB1 to MB4).

In FIG. 12B, a narrow first power supply circuit block PB1 is disposed along the direction D1 between the circuit blocks CB1 to CBN (data driver blocks DB1 to DB4) and the input-side I/F region 14 (second interface region). The power supply circuit block PB1 is a circuit block which has a long side along the direction D1 and a short side along the direction D2 and has a significantly small width in the direction D2 (narrow circuit block with a width equal to or less than the width WB). The power supply circuit block PB1 may include boost transistors of a voltage booster circuit which increases voltage by a charge-pump operation, a boost control circuit, and the like.

In FIGS. 12A and 12B, the second power supply circuit block PB2 may include a power supply register section into which power supply adjustment data for adjusting the power supply voltage is written, a regulator which regulates voltage increased by a voltage booster circuit which increases voltage by a charge pump operation, and the like.

In FIG. 12B, the grayscale voltage generation circuit block GB is not adjacent to the logic circuit block LB, and the data driver blocks DB1 to DB4 (memory blocks MB1 to MB4) are disposed between the grayscale voltage generation circuit block GB and the logic circuit block LB. The data driver blocks DB1 to DB4 (memory blocks MB1 to MB4) are disposed between the power supply circuit block PB2 and the logic circuit block LB. The grayscale voltage generation circuit block GB is disposed between the power supply circuit block PB2 and the data driver blocks DB1 to DB4. A modification is also possible in which the grayscale voltage generation circuit block GB and the logic circuit block LB are adjacently disposed along the direction D1.

In FIGS. 12A and 12B, an information storage block ISB such as a fuse block is provided. The logic circuit block LB is disposed between the data driver blocks DB1 to DB4 (memory blocks MB1 to MB4) and the information storage block ISB. In other words, the information storage block ISB is disposed adjacent to the logic circuit block LB along the direction D1, for example. A modification in which the information storage block ISB is disposed adjacent to the logic circuit block LB on the direction D3 side of the logic circuit block LB or a modification in which the information storage block ISB is not disposed adjacent to the logic circuit block LB is also possible.

In FIG. 12B, the information storage block ISB is disposed on the direction D4 side of the scan driver block SB2. Specifically, the information storage block ISB is disposed in the region on the direction D1 side of the logic circuit block LB and the direction D4 side of the scan driver block SB2.

The layout arrangement of the integrated circuit device 10 according to this embodiment is not limited to those shown in FIGS. 12A and 12B. For example, the number of memory blocks or data driver blocks may be two, three, or five or more, or the memory block and the data driver block may not be divided into blocks. A modification is also possible in which the memory block is not adjacent to the data driver block. A configuration may be employed in which the memory block, the scan driver block, the power supply circuit block, or the grayscale voltage generation circuit block is not provided. For example, the memory block may be omitted when the integrated circuit device 10 does not include a memory. The scan driver block may be omitted when the scan driver can be formed on the glass substrate of the display panel. In a color super twisted nematic (CSTN) panel display driver or a thin film diode (TFD) panel display driver, the grayscale voltage generation circuit block may be omitted. A circuit block having a significantly small width in the direction D2 (narrow circuit block with a width equal to or less than the width WB) may be provided between the circuit blocks CB1 to CBN and the output-side I/F region 12 or the input-side I/F region 14. The circuit blocks CB1 to CBN may include a circuit block in which different circuit blocks are arranged in stages along the direction D2. For example, the scan driver circuit and the power supply circuit may be integrated into one circuit block.

Figure 13A:
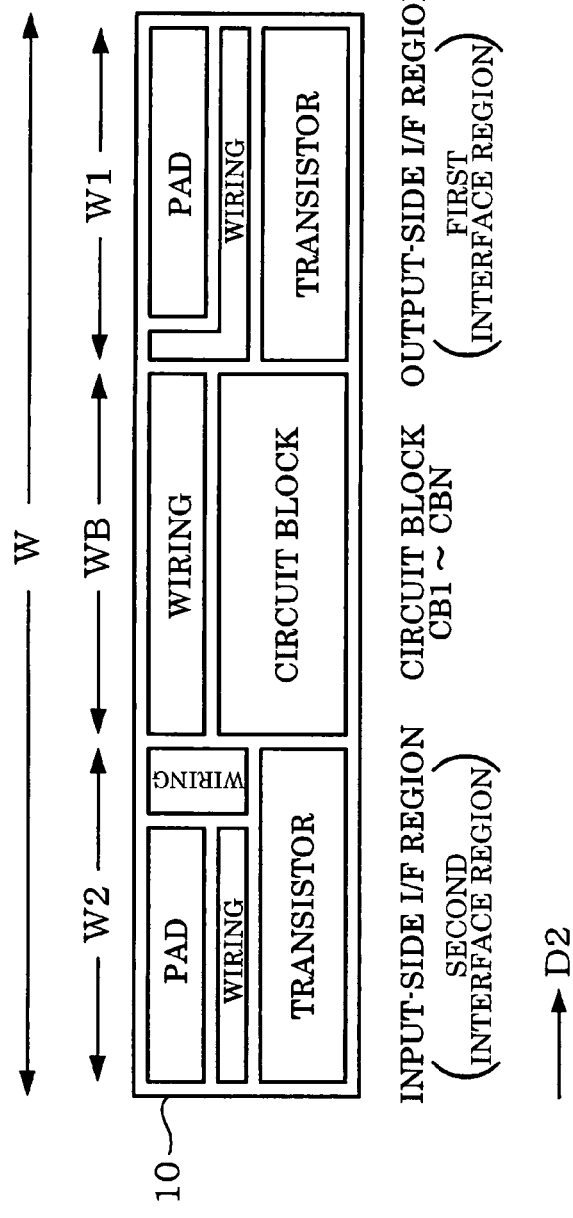
FIGS. 13A and 13B show examples of the cross-sectional view of the integrated circuit device.

FIG. 13A shows an example of a cross-sectional view of the integrated circuit device 10 along the direction D2. W1, WB, and W2 respectively indicate the widths of the output-side I/F region 12, the circuit blocks CB1 to CBN, and the input-side I/F region 14 in the direction D2. The widths W1, WB, and W2 indicate the widths (maximum widths) of the transistor formation regions (bulk regions or active regions) of the output-side I/F region 12, the circuit blocks CB1 to CBN, and the input-side I/F region 14, respectively, and exclude the bump formation regions. W indicates the width of the integrated circuit device 10 in the direction D2. In this case, the relationship $W1+WB+W2 \leq W<W1+2\times WB+W2$ is satisfied, for example. Or, since $W1+W2<WB$ is satisfied, $W<2\times WB$ is satisfied.

Figure 13B:
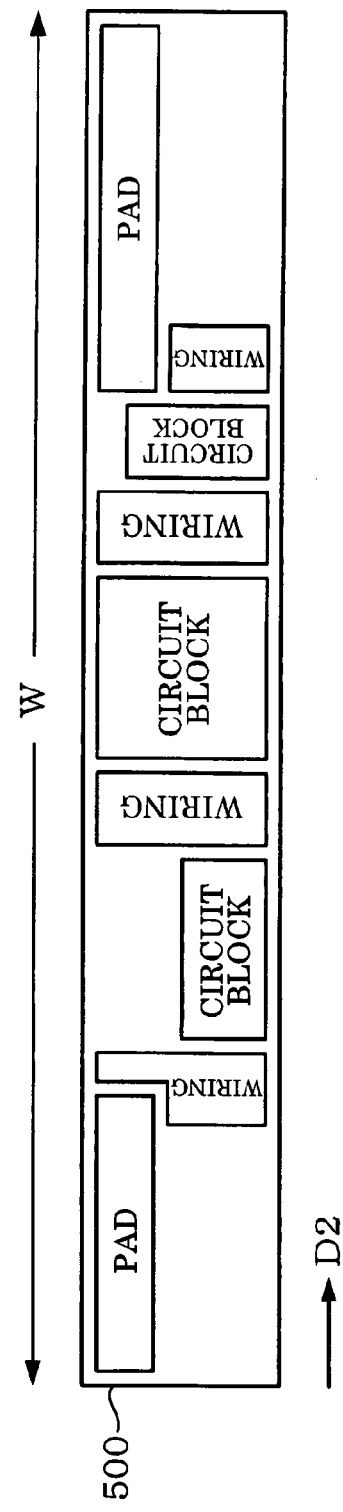

According to the arrangement method shown in FIG. 13B, two or more circuit blocks having a large width in the direction D2 are disposed along the direction D2. Specifically, the data driver block and the memory block are disposed along the direction D2.

In FIG. 13B, the image data from the host is written into the memory block, for example. The data driver block converts the digital image data written into the memory block into an analog data voltage, and drives the data line of the display panel. Therefore, the image data signal flows along the direction D2. In FIG. 13B, the memory block and the data driver block are disposed along the direction D2 corresponding to the signal flow.

However, the arrangement method shown in FIG. 13B has the following problems.

First, a reduction in chip size is required for an integrated circuit device such as a display driver in order to reduce cost. However, if the chip size is reduced by merely shrinking the integrated circuit device using a microfabrication technology, the size of the integrated circuit device is reduced not only in the short side direction but also in the long side direction. This makes mounting difficult due to the narrow pitch.

Second, the configurations of the memory and the data driver of the display driver are changed depending on the type of display panel (amorphous TFT or low-temperature polysilicon TFT), the number of pixels (QCIF, QVGA, or VGA), the specification of the product, and the like. According to the arrangement method shown in FIG. 13B, even if the pad pitch, the cell pitch of the memory, and the cell pitch of the data driver coincide in a certain product, the pitches do not coincide when the configurations of the memory and the data driver are changed. If the pitches do not coincide, an unnecessary wiring region must be formed between the circuit blocks in order to absorb the difference in pitch. As a result, the width of the integrated circuit device in the direction D2 increases, whereby cost is increased due to an increase in the chip area. If the layout of the memory and the data driver is changed so that the pad pitch coincides with the cell pitch in order to avoid such a situation, the development period increases, whereby cost is increased.

According to the arrangement method shown in FIGS. 11 to 12B, the circuit blocks CB1 to CBN are disposed along the direction D1. In FIG. 13A, the transistor (circuit element) can be disposed under the pad (bump) (active surface bump). Moreover, signal lines between the circuit blocks and between the circuit block and the I/F region can be formed using global lines formed in an upper layer (lower layer of the pads) of local lines provided in the circuit blocks. Therefore, the width W of the integrated circuit device 10 in the direction D2 can be reduced while maintaining the length of the integrated circuit device 10 in the direction D1, whereby a narrow chip can be realized.

According to the arrangement method shown in FIGS. 11 to 12B, since the circuit blocks CB1 to CBN are disposed along the direction D1, it is possible to easily deal with a change in the product specification and the like. Specifically, since products of various specifications can be designed using a common platform, the design efficiency can be improved. For example, when the number of pixels or the number of grayscales of the display panel is increased or decreased, it is possible to deal with such a situation by merely increasing or decreasing the number of memory blocks or data driver blocks, the image data read count in one horizontal scan period, and the like. For example, when the scan driver can be formed on the display panel such as a low-temperature polysilicon TFT panel, it suffices to remove the scan driver block from the circuit blocks CB1 to CBN. When developing a product which does not include a memory, it suffices to remove the memory block. Even if the circuit block is removed conforming to the specification, the effects on the remaining circuit blocks are minimized, whereby the design efficiency can be improved.

According to the arrangement method shown in FIGS. 11 to 12B, the widths (heights) of the circuit blocks CB1 to CBN in the direction D2 can be adjusted to the width (height) of the data driver block or the memory block, for example. When the number of transistors of each circuit block is increased or decreased, it is possible to deal with such a situation by increasing or decreasing the length of each circuit block in the direction D1. Therefore, the design efficiency can be further improved. For example, when the number of transistors of each circuit block is increased or decreased due to a change in the configuration of the grayscale voltage generation circuit block or the logic circuit block, it is possible to deal with such a situation by increasing or decreasing the length of the grayscale voltage generation circuit block or the logic circuit block in the direction D1.

4. Arrangement of Information Storage Block

As shown in FIG. 14A, the integrated circuit device according to this embodiment includes the first to Nth circuit blocks CB1 to CBN and the information storage block ISB. The circuit blocks CB1 to CBN include the data driver blocks DB1 to DB4 (at least one data driver block in a broad sense) and the logic circuit block LB.

The data driver blocks DB1 to DBI are circuits for driving the data lines of the display panel, and the logic circuit block LB is a circuit which controls the data driver blocks DB1 to DBI. For example, the logic circuit block LB generates driver control signals for controlling the data driver blocks DB1 to DBI, and outputs the driver control signals to the data driver blocks DB1 to DBI.

The initial adjustment information (initial setting information or initial programming information) for performing the initial adjustment of the circuit block (e.g. memory, data driver, scan driver, power supply circuit, grayscale voltage generation circuit, or oscillation circuit) of the integrated circuit device is programmed and stored in the information storage block ISB. For example, initial adjustment information relating to the elements (e.g. resistor, capacitor, and fuse element) used in the circuit block of the integrated circuit device, initial adjustment information relating to the voltage (reference voltage) and the current (reference current) generated by the circuit block, and initial adjustment information relating to the operation of the circuit block are stored in the information storage block ISB.

For example, characteristic information (presence or absence of defective cell, oscillation frequency, reference voltage, and AC timing) of the integrated circuit device is measured in the inspection step during the production of the integrated circuit device. The initial adjustment information is determined based on the measurement results, and the determined initial adjustment information is programmed and stored in the information storage block ISB. This causes the integrated circuit device to operate based on the initial adjustment information programmed in the information storage block ISB, whereby the integrated circuit device can be operated in an optimum state.

For example, when a defective cell (defective memory cell) is found in the memory block of the integrated circuit device in the inspection step, the address of the defective cell is programmed in the information storage block ISB as initial adjustment information.

The oscillation frequency of the oscillation circuit for generating the clock signal of the integrated circuit device is measured in the inspection step. Adjustment information for adjusting the oscillation frequency to the optimum frequency conforming to the specification is programmed in the information storage block ISB as initial adjustment information.

The reference voltage (synonymous with the reference current) generated by the reference voltage generation circuit of the integrated circuit device is measured in the inspection step. Adjustment information for adjusting the reference voltage to the optimum voltage (current) conforming to the specification is programmed in the information storage block ISB as initial adjustment information.

The AC timing of various signals of the integrated circuit device is measured in the inspection step. Adjustment information for adjusting the AC timing of the signal to the optimum timing conforming to the specification is programmed in the information storage block ISB as initial adjustment information.

A fuse block may be used as the information storage block ISB, for example. The fuse block includes fuse elements, and the initial adjustment information can be programmed by blowing or not blowing the fuse elements. A nonvolatile memory such as a one-time PROM (OTP) may also be used as the information storage block ISB. For example, the initial adjustment information which can be determined during the production of the integrated circuit device is programmed in the information storage block ISB formed of a fuse block, an OTP, or the like. On the other hand, adjustment information (e.g. VCOM voltage) which cannot be determined during the production of the integrated circuit device and must be adjusted by the manufacturer or the like which uses the integrated circuit device may be stored in a multi-time PROM (MTP) or the like.

In the embodiment, the logic circuit block LB is disposed between the data driver blocks DB1 to DBI and the information storage block ISB, as shown in FIG. 14A. Specifically, the data driver blocks DB1 to DBI (memory blocks) are disposed on the direction D3 side of the logic circuit block LB, and the information storage block ISB is disposed on the direction D1 side of the logic circuit block LB, for example.

In FIG. 14A, the logic circuit block LB must output the driver control signals for controlling the data driver blocks DB1 to DBI to the data driver blocks DB1 to DBI disposed on the direction D3 side of the logic circuit block LB, for example. As shown in FIG. 14A, when disposing the circuit blocks CB1 to CBN along the direction D1, a large number of global lines for connecting the nonadjacent circuit blocks must be provided along the direction D1. Therefore, a large number of signal lines (power supply lines) are provided on the direction D3 side of the logic circuit block LB, whereby a sufficient wiring space cannot be provided.

On the other hand, the initial adjustment information stored in the information storage block ISB is mainly used by the logic circuit block LB. Therefore, a large number of signal lines are also provided between the logic circuit block LB and the information storage block ISB.

Accordingly, when disposing the information storage block ISB on the direction D3 side of the logic circuit block LB instead of disposing the information storage block ISB on the direction D1 side of the logic circuit block LB, for example, the number of signal lines provided on the information storage block ISB significantly increases. Specifically, when disposing the information storage block ISB between the data driver blocks DB1 to DBI and the logic circuit block LB, the number of signal lines such as the global lines which must be provided along the direction D1 increases, whereby the wiring region becomes insufficient. As a result, the wiring efficiency deteriorates due to an increase in the number of signal lines provided along the direction D1, whereby the width W of the integrated circuit device in the direction D2 may increase.

According to the arrangement method shown in FIG. 14A, the logic circuit block LB is disposed between the data driver blocks DB1 to DBI and the information storage block ISB, and the information storage block ISB is disposed on the direction D1 side of the logic circuit block LB. Therefore, the global lines and the like provided on the direction D3 side of the logic circuit block LB do not overlap the signal lines provided between the logic circuit block LB and the information storage block ISB. Accordingly, the wiring region for the global lines and the like is sufficiently provided, whereby the wiring efficiency can be improved. As a result, the width W of the integrated circuit device in the direction D2 can be reduced, whereby a narrow chip cannot be realized.

When disposing the information storage block ISB between the data driver blocks DB1 to DBI and the logic circuit block LB, it is necessary to provide the global lines and the like on the information storage block ISB, whereby it becomes difficult to program the initial adjustment information in the information storage block ISB. For example, when using a fuse block as the information storage block ISB, the signal lines cannot be provided on the fuse elements.

According to the arrangement method shown in FIG. 14A, the information storage block ISB is disposed in the region on the direction D1 side of the logic circuit block LB in which the signal lines are not overcrowded. This makes it unnecessary to provide the global lines and the like on the information storage block ISB. Therefore, even when using a fuse block as the information storage block ISB, it is possible to easily conform to the restrictions in which the signal lines cannot be provided on the fuse elements.

When disposing the circuit blocks CB1 to CBN along the direction D1, as shown in FIGS. 12A and 12B, the arrangement region of the data driver block or the memory block does not have enough room. Therefore, when disposing the information storage block ISB in the arrangement region of the data driver block or the memory block, the width W of the integrated circuit device in the direction D2 increases, thereby making it difficult to realize a narrow chip. On the other hand, when disposing the information storage block ISB in the region on the direction D3 side of the data driver block or the memory block (i.e., the region of the power supply circuit block or the grayscale voltage generation circuit block), the signal lines between the information storage block ISB and the logic circuit block LB must be provided along the direction D1 over a long distance. Therefore, the wiring efficiency of the signal lines along direction D1 deteriorates, whereby the width W of the integrated circuit device in the direction D2 increases.

According to the arrangement method shown in FIG. 14A, since the length of the signal line provided between the information storage block ISB and the logic circuit block LB can be reduced, the wiring efficiency can be improved, whereby a narrow chip can be realized.

As shown in FIG. 14B, the information storage block ISB may be disposed adjacent to the logic circuit block LB. Specifically, the information storage block ISB and the logic circuit block LB are adjacently disposed along the direction D1.

According to the arrangement method shown in FIG. 14B, the information storage block ISB and the logic circuit block LB can be connected via the signal line along a short path, whereby the length of the signal line can be minimized. Therefore, an increase in chip area due to the wiring region of the signal lines can be prevented, whereby the area of the integrated circuit device can be reduced.

When programming the address of the defective cell in the information storage block ISB as the initial adjustment information, the switch control circuit SC is necessary which controls switching from access to the defective cell to access to the redundant cell. According to the arrangement method shown in FIG. 14A, the switch control circuit SC is easily formed in the logic circuit block LB by automatic placement and routing. Specifically, the switch control circuit SC can be formed as part of the gate array of the logic circuit block LB. This makes it unnecessary to manually place and route the switch control circuit SC, whereby the efficiency of the design and the layout operation can be improved. Moreover, it becomes possible to easily deal with a situation in which the number of bits of the address of the defective cell and the like are changed due to a change in the specification.

In FIG. 14B, the information storage block ISB is disposed adjacent to the logic circuit block LB on the direction D1 side of the logic circuit block LB. Note that the information storage block ISB may be disposed adjacent to the logic circuit block LB on the direction D3 side of the logic circuit block LB. In this case, the signal lines (e.g. the signal line of the defective address DFA) between the logic circuit block LB and the information storage block ISB can be provided using the local lines under the global lines. Therefore, an increase in chip area due to the wiring region can be minimized.

Figure 15A:
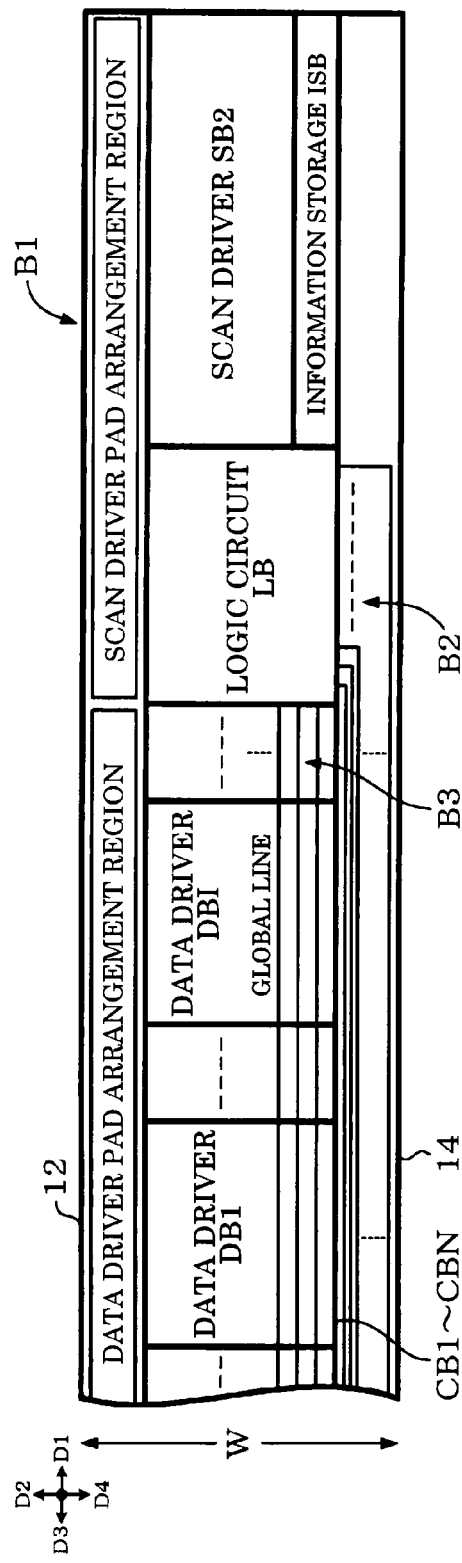
FIGS. 15A and 15B are views illustrative of an information storage block arrangement method.

FIG. 15A shows a detailed layout example of the information storage block ISB. In FIG. 15A, the circuit blocks CB1 to CBN include at least one scan driver block SB2 for driving the scan lines of the display panel. When the direction opposite to the direction D2 is the direction D4, the information storage block ISB is disposed on the direction D4 side of the scan driver block SB2. Specifically, the information storage block ISB is disposed in the region on the direction D1 side of the logic circuit block LB and the direction D4 side of the scan driver block SB2.

In FIG. 15A, pads for the scan driver (gate driver) are disposed utilizing the free space on the direction D2 side of the scan driver block SB2 and the logic circuit block LB, as indicated by B1, for example. Therefore, a large number of signal lines corresponding to the number of scan lines (gate lines) of the display panel must be provided between the scan driver pad arrangement region indicated by B1 and the scan driver block SB2. Accordingly, the signal line arrangement region does not have enough room in the region on the direction D2 side of the scan driver block SB2.

As indicated by B2 in FIG. 15A, a large number of signal lines from the pads disposed in the input-side I/F region 14 must be connected to the logic circuit block LB. Accordingly, the signal line arrangement region does not have enough room in the region on the direction D4 side of the logic circuit block LB.

As indicated by B3 in FIG. 15A, a large number of global lines must be provided along the direction D1 in the region on the direction D3 side of the logic circuit block LB. Accordingly, the signal line arrangement region does not have enough room in the region on the direction D3 side of the logic circuit block LB.

In FIG. 15A, the information storage block ISB is disposed in the region on the direction D4 side of the scan driver block SB2 (i.e., the region on the direction D1 side of the logic circuit block LB) instead of the regions indicated by B1, B2, and B3 in which a large number of signal lines are provided. This enables the information storage block ISB to be disposed in the region in which additional signal lines can be provided. Therefore, an increase in chip area due to the wiring region can be minimized. Moreover, since the global lines and the like need not be provided on the information storage block ISB, even when using a fuse block as the information storage block ISB, it is possible to easily conform to the restrictions in which the signal lines cannot be provided on the fuse elements, for example.

Figure 15B:
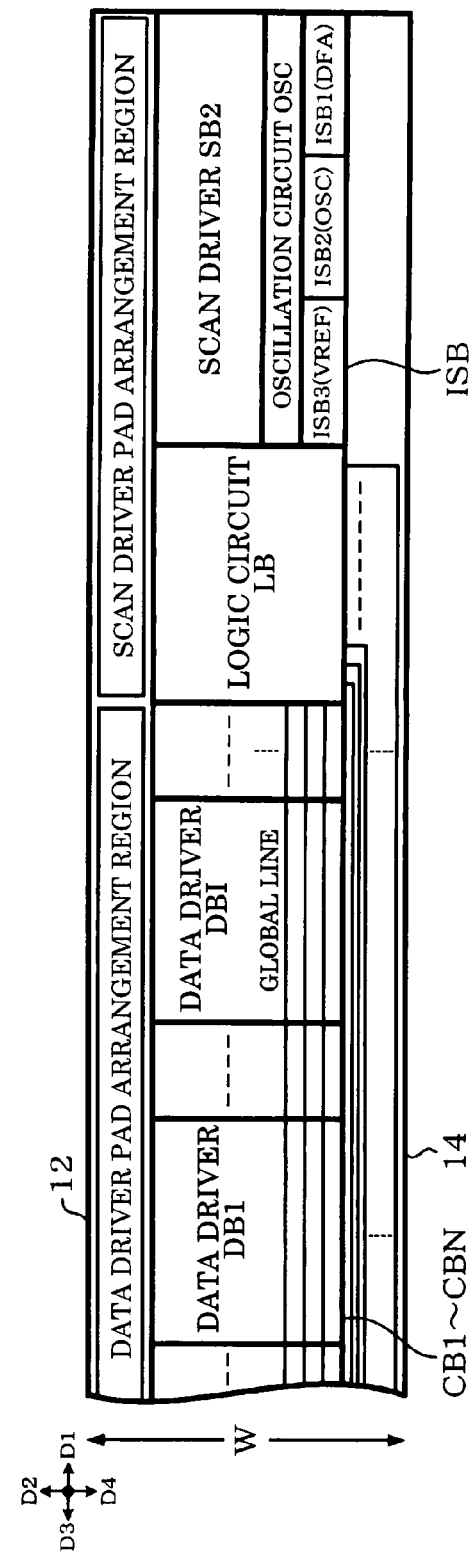

FIG. 15B shows a further detailed layout example of the information storage block ISB. In FIG. 15B, the integrated circuit device includes an oscillation circuit block OSC for generating a clock signal. Adjustment information of the oscillation frequency of the oscillation circuit block OSC is programmed and stored in the information storage block ISB as initial adjustment information. The oscillation circuit block OSC is disposed between the scan driver block SB2 and the information storage block ISB.

Figure 16:
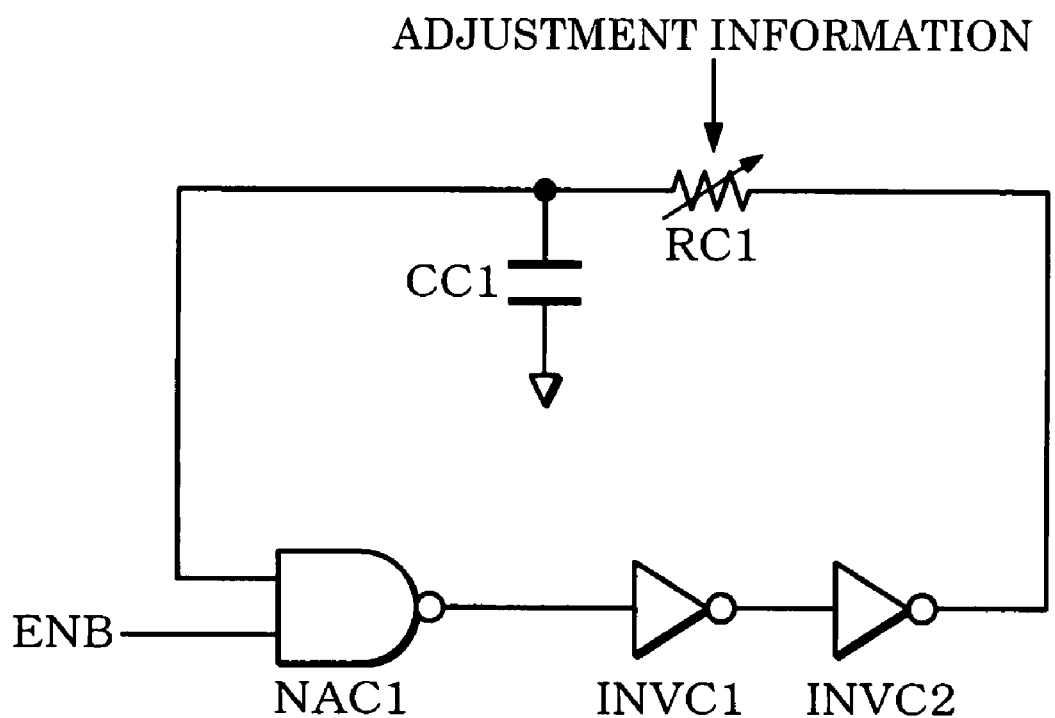
FIG. 16 shows a configuration example of an oscillation circuit block.

FIG. 16 shows the circuit configuration of the oscillation circuit block OSC, for example. The oscillation circuit block OSC includes a NAND circuit NAC1, inverter circuits INVC1 and INVC2, a variable resistor RC1, and a capacitor CC1, and forms an oscillation loop. An oscillation starts when setting an enable signal ENB input to the NAND circuit NAC1 at the H level.

In FIG. 16, the oscillation frequency is changed by adjusting the resistance value of the variable resistor RC1, for example. In this case, adjustment information for obtaining the optimum oscillation frequency is programmed and stored in the information storage block ISB. This minimizes the variation in the oscillation frequency due to a change in the manufacturing process.

The adjustment information signal line can be provided between the oscillation circuit block OSC and the information storage block ISB along a short path by disposing the oscillation circuit block OSC as shown in FIG. 15B. Therefore, an increase in chip area due to the wiring region of these signal lines can be prevented. Moreover, the clock signal generated by the oscillation circuit block OSC can be supplied to the logic circuit block LB along a short path, whereby the layout efficiency can be increased.

In FIG. 15B, first to third storage blocks ISB1 to ISB3 (first to mth storage blocks in a broad sense) in which first to third initial adjustment information (first to mth initial adjustment information in a broad sense; m is an integer equal to or larger than two) is programmed and stored are disposed in the information storage block ISB.

The address DFA of the defective cell of the memory block is programmed and stored in the first storage block ISB1 as initial adjustment information. The adjustment information of the oscillation frequency of the oscillation circuit block OSC is programmed and stored in the second storage block ISB2 as initial adjustment information. The adjustment information of the reference voltage generated by the reference voltage generation circuit (VREF) is programmed and stored in the third storage block ISB3 as initial adjustment information. In FIG. 15B, at least two storage blocks ISB1 to ISB3 are disposed in the information storage block ISB.

Programming in the initial adjustment information programming step is simplified by collectively disposing the storage blocks ISB1 to ISB3 in one location. This reduces the programming time, whereby the cost of the integrated circuit device can be reduced. For example, when the information storage block ISB is a fuse block, if the fuse element storage blocks are dispersed in separate locations of the integrated circuit device, it becomes difficult to specify the location of the fuse element using an inspection device. The arrangement method shown in FIG. 15B can solve such a problem. For example, when using a method of blowing the fuse element by applying a laser beam, the arrangement method shown in FIG. 15B can reduce the distance in which the laser device must move (scan) within the chip in order to blow the fuse element, whereby the period of time required for blowing the fuse element can be reduced.

Figure 17:
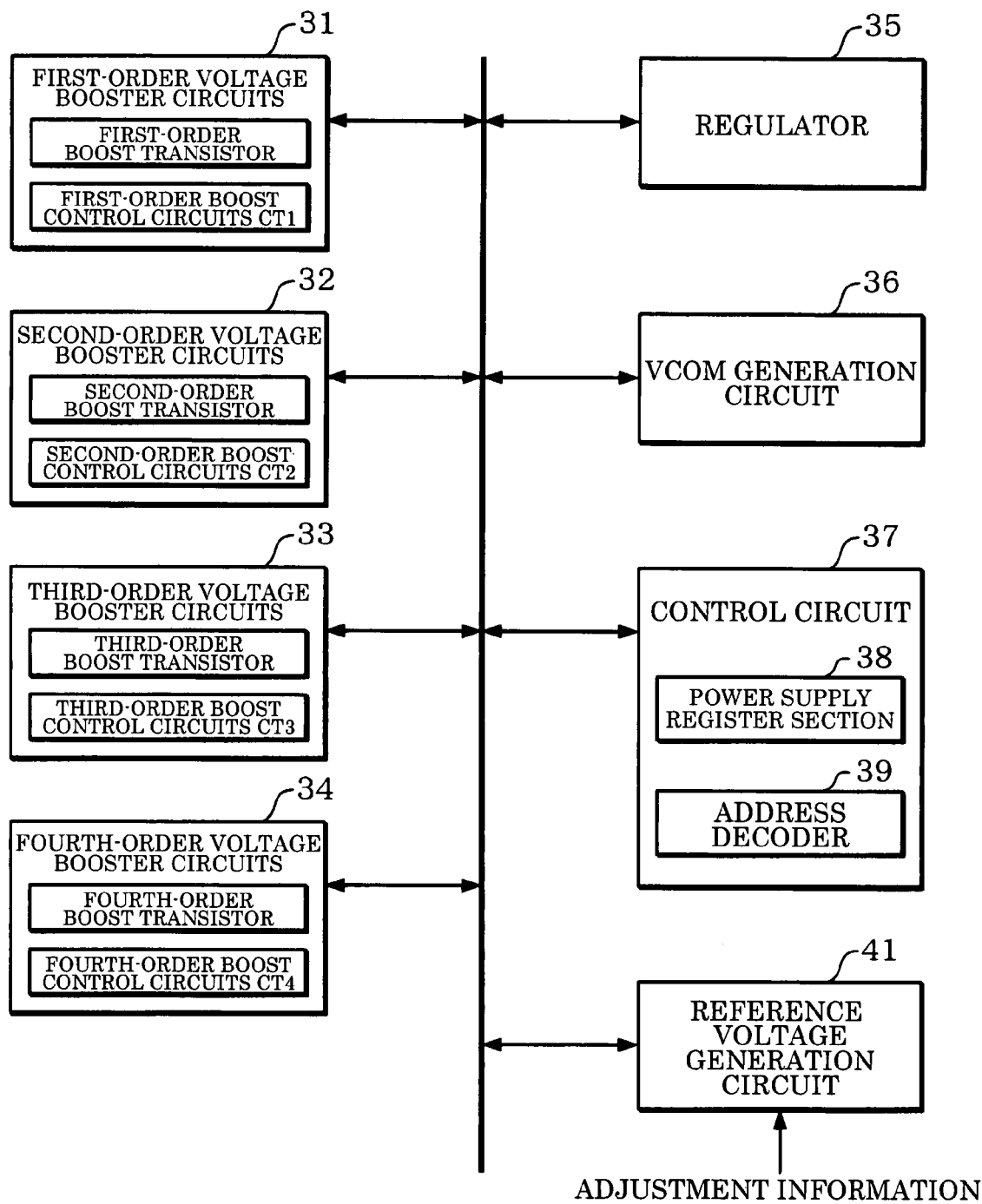
FIG. 17 shows a configuration example of a power supply circuit.

FIG. 17 shows a configuration example of the power supply circuit (power supply circuit block). The power supply circuit includes first-order to fourth-order voltage booster circuits 31 to 34 (first-order to Kth-order voltage booster circuits in a broad sense; K is an integer equal to or larger than two), a regulator 35, a VCOM generation circuit 36, a control circuit 37, and a reference voltage generation circuit 41. The first-order to fourth-order voltage booster circuits 31 to 34 (first-order to Kth-order voltage booster circuits in a broad sense) respectively include first-order to fourth-order boost transistors (first-order to Kth-order boost transistors in a broad sense) and first-order to fourth-order boost control circuits CT1 to CT4 (first-order to Kth-order boost control circuits in a broad sense), and perform first-order to fourth-order boost operations. The first-order to fourth-order boost control circuits CT1 to CT4 are circuits which respectively control the first-order to fourth-order voltage booster circuits 31 to 34, and supply boost clock signals to the first-order to fourth-order boost transistors. The VCOM generation circuit 36 generates and outputs a VCOM voltage supplied to a common electrode of the display panel. The control circuit 37 controls the power supply circuit.

The control circuit 37 includes a power supply register section 38 (index register) and an address decoder 39. The power supply register section 38 includes registers. The power supply adjustment data set by the data signal from the logic circuit is written into the register specified by the register address of an address signal from the logic circuit (logic circuit block). The address decoder 39 decodes the address signal from the logic circuit, and outputs a register address signal corresponding to the address signal.

The reference voltage generation circuit 41 generates the reference voltage (reference current) for generating the power supply voltages of the logic circuit and the grayscale voltage generation circuit. In this case, the adjustment information for obtaining the optimum reference voltage is programmed and stored in the information storage block ISB. This minimizes the variation in the reference voltage due to a change in the manufacturing process.

5. Global Wiring Method

In order to reduce the width of the integrated circuit device in the direction D2, it is necessary to efficiently provide the signal lines and the power supply lines disposed between the circuit blocks along the direction D1. Therefore, it is desirable to provide the signal lines and the power supply lines between the circuit blocks using a global wiring method.

According to the global wiring method, the local lines formed of wiring layers (e.g. first to fourth aluminum wiring layers ALA, ALB, ALC, and ALD) located under an Ith layer (I is an integer equal to or larger than three) are provided between the adjacent circuit blocks of the first to Nth circuit blocks CB1 to CBN. The global lines formed of a wiring layer (e.g. fifth aluminum wiring layer ALE) located over the Ith layer are provided between the nonadjacent circuit blocks of the first to Nth circuit blocks CB1 to CBN to pass over the circuit block disposed between the nonadjacent circuit blocks along the direction D1.

Figure 18:
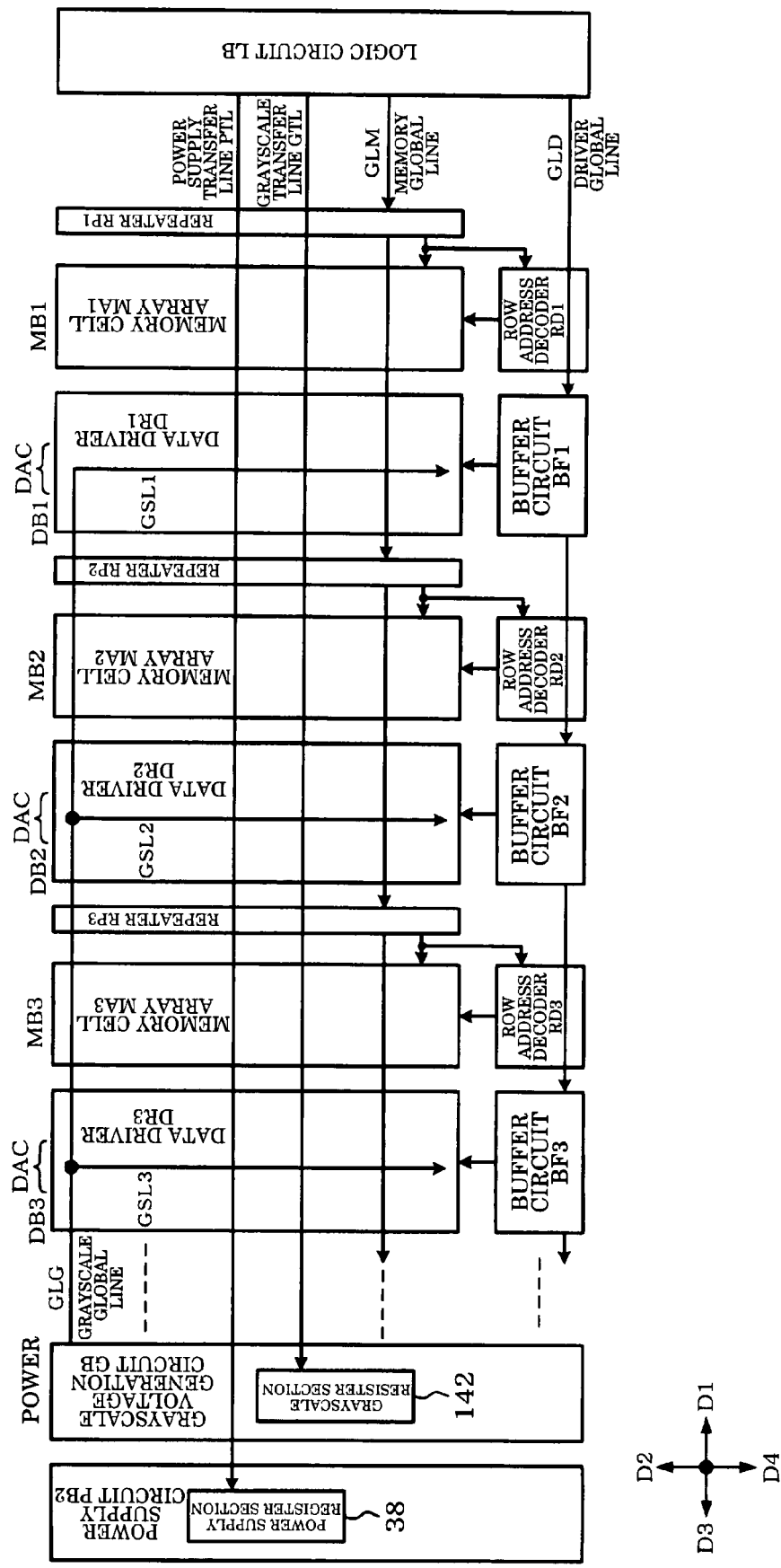
FIG. 18 is a view illustrative of a global wiring method.

FIG. 18 shows a wiring example of the global lines. In FIG. 18, a driver global line GLD for supplying the driver control signals from the logic circuit block LB to the data driver blocks DB1 to DB3 is provided over the buffer circuits BF1 to BF3 and the row address decoders RD1 to RD3. Specifically, the driver global line GLD formed of the fifth aluminum wiring layer ALE (top metal) is provided almost linearly from the logic circuit block LB along the direction D1 over the buffer circuits BF1 to BF3 and the row address decoders RD1 to RD3. The driver control signals supplied through the driver global line GLD are buffered by the buffer circuits BF1 to BF3, and input to the data drivers DR1 to DR3 disposed on the direction D2 side of the buffer circuits BF1 to BF3.

In FIG. 18, a memory global line GLM for supplying at least a write data signal (or address signal or memory control signal) from the logic circuit block LB to the memory blocks MB1 to MB3 is provided along the direction D1. Specifically, the memory global line GLM formed of the fifth aluminum wiring layer ALE is provided from the logic circuit block LB along the direction D1.

More specifically, repeater blocks RP1 to RP3 are disposed in FIG. 18 corresponding to the memory blocks MB1 to MB3. Each of the repeater blocks RP1 to RP3 includes a buffer which buffers at least the write data signal (or address signal or memory control signal) from the logic circuit block LB and outputs the write data signal to the memory blocks MB1 to MB3, respectively. As shown in FIG. 18, the memory blocks MB1 to MB3 and the repeater blocks RP1 to RP3 are adjacently disposed along the direction D1, respectively.

For example, when supplying the write data signal, the address signal, and the memory control signal from the logic circuit block LB to the memory blocks MB1 to MB3 using the memory global line GLM, the rising waveforms and the falling waveforms of these signals are rounded if these signals are not buffered. As a result, the period of time required for writing data into the memory blocks MB1 to MB3 may be increased, or a write error may occur.

When respectively disposing the repeater blocks RP1 to RP3 adjacent to the memory blocks MB1 to MB3 on the direction D1 side of the memory blocks MB1 to MB3, as shown in FIG. 18, the write data signal, the address signal, and the memory control signal are buffered by the repeater blocks RP1 to RP3 and then input to the memory blocks MB1 to MB3. As a result, rounding of the rising waveforms and the falling waveforms of the signals can be reduced, whereby data can be appropriately written into the memory blocks MB1 to MB3.

In FIG. 18, the integrated circuit device includes the grayscale voltage generation circuit block GB which generates the grayscale voltage. A grayscale global line GLG for supplying the grayscale voltage from the grayscale voltage generation circuit block GB to the data driver blocks DB1 to DB3 is provided along the direction D1. Specifically, the grayscale global line GLG formed of the fifth aluminum wiring layer ALE is provided from the grayscale voltage generation circuit block GB along the direction D1. Grayscale voltage supply lines GSL1 to GSL3 for supplying the grayscale voltage from the grayscale global line GLG to the data drivers DR1 to DR3 are respectively provided in the data drivers DR1 to DR3 along the direction D2.

In FIG. 18, the memory global line GLM is provided between the grayscale global line GLG and the driver global line GLD along the direction D1.

In FIG. 18, the buffer circuits BF1 to BF3 and the row address decoders RD1 to RD3 are disposed along the direction D1. The wiring efficiency can be significantly improved by providing the driver global line GLD from the logic circuit block LB along the direction D1 over the buffer circuits BF1 to BF3 and the row address decoders RD1 to RD3.

It is necessary to supply the grayscale voltage from the grayscale voltage generation circuit block GB to the data drivers DR1 to DR3. Therefore, the grayscale global line GLG is provided along the direction D1.

The address signal, the memory control signal, and the like are supplied to the row address decoders RD1 to RD3 through the memory global line GLM. Therefore, it is desirable to provide the memory global line GLM near the row address decoders RD1 to RD3.

In FIG. 18, the memory global line GLM is provided between the grayscale global line GLG and the driver global line GLD. Therefore, the address signal, the memory control signal, and the like from the memory global line GLM can be supplied to the row address decoders RD1 to RD3 through a short path. The grayscale global line GLG can be provided almost linearly along the direction D1 over the memory global line GLM. Accordingly, the global lines GLC, GLM, and GLD can be provided using one aluminum wiring layer ALE without causing the global lines GLG, GLM, and GLD to intersect, whereby the wiring efficiency can be improved.

In FIG. 18, a grayscale transfer line GTL is provided over the data driver blocks DB1 to DB3 along the direction D1 using the global line. In this case, the grayscale adjustment data is transferred by time division through the grayscale transfer line GTL. Therefore, the number of grayscale transfer lines GTL (global lines) can be reduced as compared with a method of transferring the grayscale adjustment data at one time using parallel transfer lines. This makes it possible to deal with a situation in which it is difficult to provide additional global lines due to an increase in the number of driver, memory, and grayscale global lines GLD, GLM, and GLG. Therefore, a situation can be prevented in which the width of the integrated circuit device in the direction D2 increases due to an increase in the number of grayscale transfer lines GTL, whereby the area of the integrated circuit device can be reduced.

In FIG. 18, a power supply transfer line PTL is provided over the data driver blocks DB1 to DB3 along the direction D1 using the global line. The logic circuit block LB transfers the power supply adjustment data to the power supply circuit block PB by time division through the power supply transfer line PTL.

6. Block Division

Figure 19A:
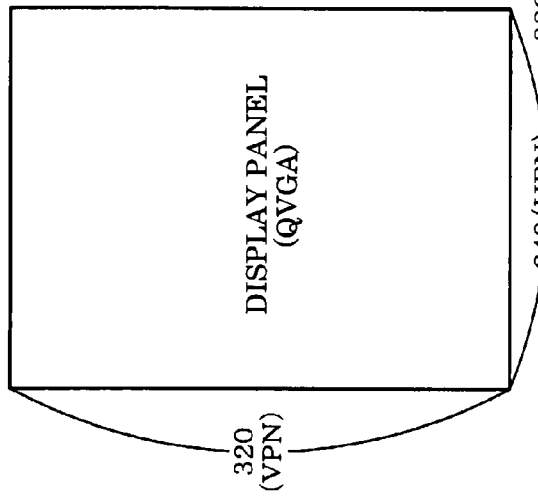
FIGS. 19A and 19B are views illustrative of a block division method for a memory and a data driver.

Suppose that the display panel is a QVGA panel in which the number of pixels in the vertical scan direction (data line direction) is VPN=320 and the number of pixels in the horizontal scan direction (scan line direction) is HPN=240, as shown in FIG. 19A. Suppose that the number of bits PDB of image (display) data of one pixel is PDB=24 bits (8 bits each for R, G, and B). In this case, the number of bits of image data necessary for displaying one frame of the display panel is VPN×HPN×PDB=320×240×24 bits. Therefore, the memory of the integrated circuit device stores at least 320×240×24 bits of image data. The data driver outputs data signals of HPN=240 data lines (data signals corresponding to 240×24 bits of image data) to the display panel in units of horizontal scan periods (in units of periods in which one scan line is scanned).

Figure 19B:
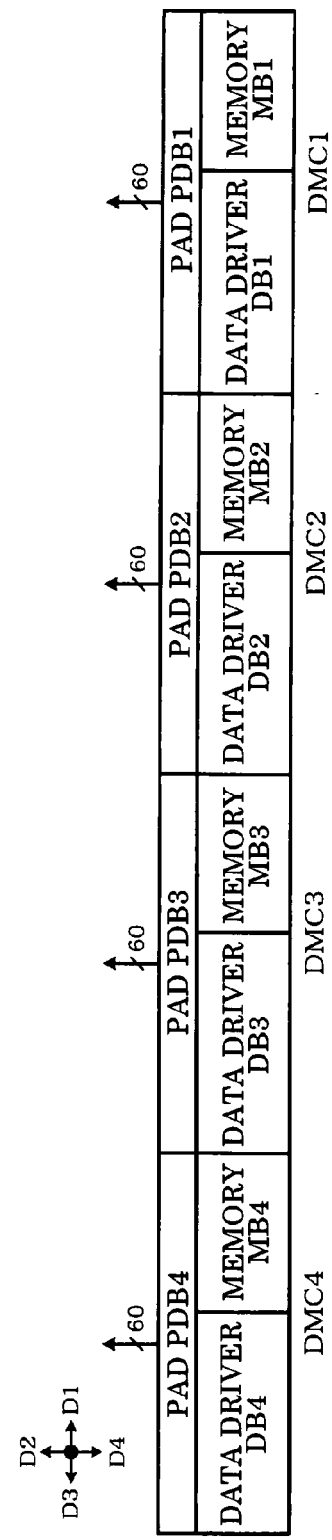

In FIG. 19B, the data driver is divided into four (DBN=4) data driver blocks DB1 to DB4. The memory is also divided into four (MBN=DBN=4) memory blocks MB1 to MB4. Specifically, four driver macrocells DMC1, DMC2, DMC3, and DMC4 are disposed along the direction D1, wherein each of the driver macrocells DMC1, DMC2, DMC3, and DMC4 includes the data driver block, the memory block, and the pad block, for example. Therefore, each of the data driver blocks DB1 to DB4 outputs the data signals of 60 (HPN/DBN=240/4=60) data lines to the display panel in units of horizontal scan periods. Each of the memory blocks MB1 to MB4 stores (VPN×HPN×PDB)/MBN=(320×240×24)/4 bits of image data.

7. A Plurality of Read Operations in One Horizontal Scan Period

In FIG. 19B, each of the data driver blocks DB1 to DB4 outputs the data signals of 60 data lines (60×3=180 data lines when three data lines are provided for R, G, and B) in one horizontal scan period. Therefore, the image data corresponding to the data signals of 240 data lines must be read from the data driver blocks DB1 to DB4 corresponding to the data driver blocks DB1 to DB4 in units of horizontal scan periods.

However, when the number of bits of image data read in units of horizontal scan periods increases, it is necessary to increase the number of memory cells (sense amplifiers) arranged along the direction D2. As a result, the width W of the integrated circuit device in the direction D2 increases, whereby the width of the chip cannot be reduced. Moreover, since the length of the wordline WL increases, a signal delay occurs in the wordline WL.

In order to solve such problems, it is desirable to employ a method in which the image data stored in the memory blocks MB1 to MB4 is read from the memory blocks MB1 to MB4 into the data driver blocks DB1 to DB4 a plurality of times (RN times) in one horizontal scan period.

Figure 20:
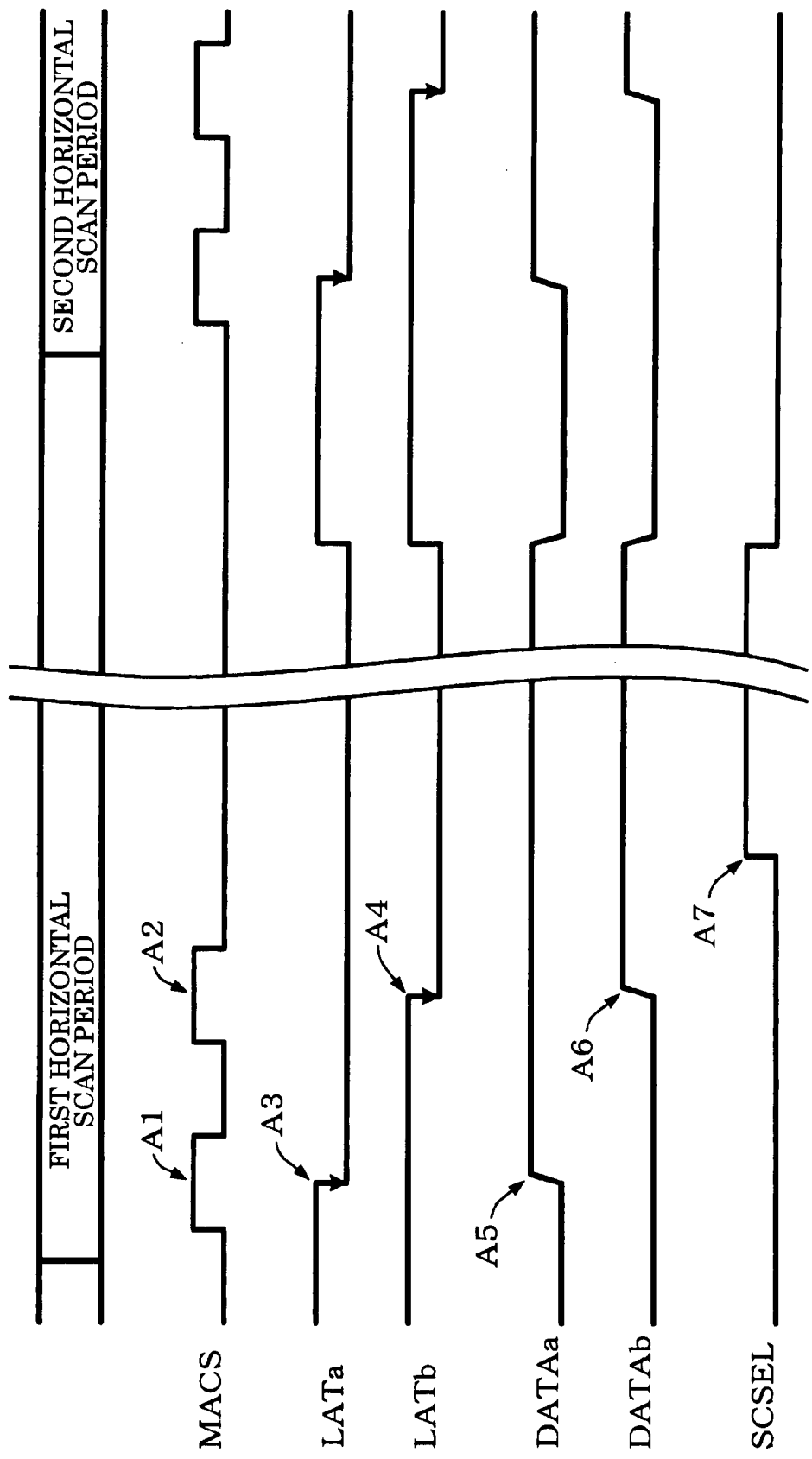
FIG. 20 is a view illustrative of a method of reading image data two or more times in one horizontal scan period.
Figure 21:
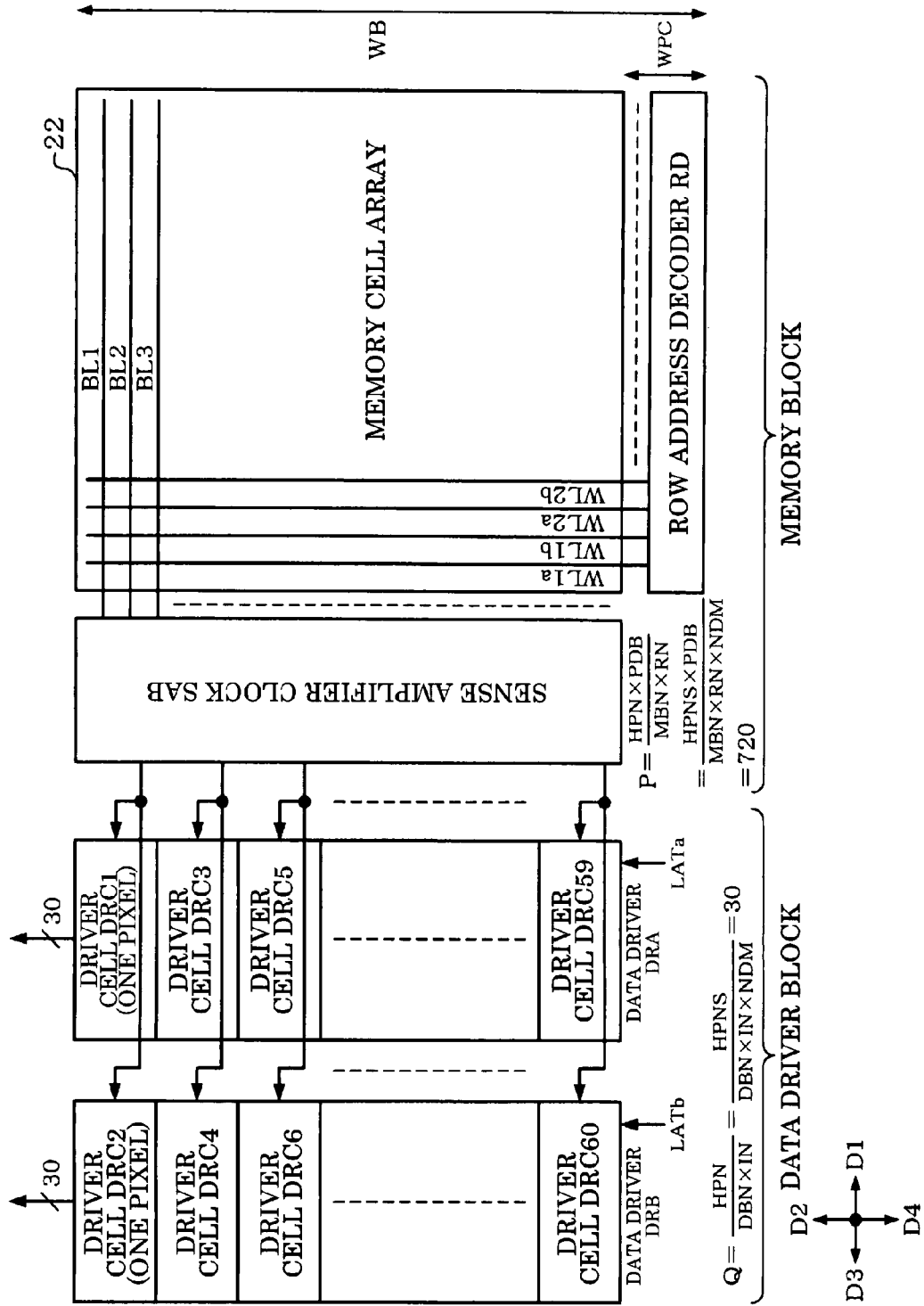
FIG. 21 shows an arrangement example of data drivers and driver cells.

In FIG. 20, a memory access signal MACS (word select signal) goes active (high level) twice (RN=2) in one horizontal scan period, as indicated by A1 and A2, for example. This causes the image data to be read from each memory block into each data driver block twice (RN=2) in one horizontal scan period. Then, data latch circuits of data drivers DRa and DRb shown in FIG. 21 provided in the data driver block latch the read image data based on latch signals LATa and LATb indicated by A3 and A4. Multiplexers of the data drivers DRa and DRb multiplex the latched image data, and D/A converters of the data drivers DRa and DRb subject the multiplexed image data to D/A conversion. Output circuits of the data drivers DRa and DRb output data signals DATAa and DATAb obtained by D/A conversion, as indicated by A5 and A6. A scan signal SCSEL input to the gate of the TFT of each pixel of the display panel goes active, as indicated by A7, and the data signal is input to and held by each pixel of the display panel.

In FIG. 20, the image data is read twice in the first horizontal scan period, and the data signals DATAa and DATAb are output to the data signal output line in the first horizontal scan period. Note that the image data may be read twice and latched in the first horizontal scan period, and the data signals DATAa and DATAb corresponding to the latched image data may be output to the data signal output line in the second horizontal scan period. FIG. 20 shows the case where the read count is RN=2. Note that RN may be equal to or larger than three (RN>3).

According to the method shown in FIG. 20, the image data corresponding to the data signals of 30 data lines is read from each memory block, and each of the data drivers DRa and DRb outputs the data signals of 30 data lines, as shown in FIG. 21. This allows the data signals of 60 data lines to be output from each data driver block. As described above, it suffices that the image data corresponding to the data signals of 30 data lines be read from each memory block in one read operation in FIG. 20. Therefore, the number of memory cells and sense amplifiers in the direction D2 in FIG. 21 can be reduced as compared with a method of reading the image data only once in one horizontal scan period. As a result, the width of the integrated circuit device in the direction D2 can be reduced, whereby a narrow chip can be realized. In particular, one horizontal scan period is about 52 microseconds in the case of a QVGA display panel. On the other hand, the memory read time is about 40 nanoseconds, which is sufficiently shorter than 52 microseconds. Therefore, even if the read count in one horizontal scan period is increased from one to two or more, the display characteristics are not affected to a large extent.

FIG. 19A shows a QVGA (320×240) display panel. It is possible to deal with a VGA (640×480) display panel by increasing the read count in one horizontal scan period to four (RN=4), for example, whereby the degrees of freedom of the design can be increased.

A plurality of read operations in one horizontal scan period may be achieved using a first method in which the row address decoder (wordline select circuit) selects different wordlines in each memory block in one horizontal scan period or a second method in which the row address decoder (wordline select circuit) selects a single wordline in each memory block a plurality of times in one horizontal scan period. Alternatively, a plurality of read operations in one horizontal scan period may be achieved by combining the first method and the second method.

In FIG. 21, the data driver block includes the data drivers DRa and DRb adjacently disposed along the direction D1. Each of the data drivers DRa and DRb includes driver cells.

When the wordline WL1$a$ of the memory block has been selected and the first image data has been read from the memory block, as indicated by A1 in FIG. 20, the data driver DRa latches the read image data based on the latch signal LATa indicated by A3, and multiplexes the latched image data. The data driver DRa subjects the multiplexed image data to D/A conversion, and outputs the data signal DATAa corresponding to the first image data, as indicated by A5.

When the wordline WL1$b$ of the memory block has been selected and the second image data has been read from the memory block, as indicated by A2 in FIG. 20, the data driver DRb latches the read image data based on the latch signal LATb indicated by A4, and multiplexes the latched image data. The data driver DRb subjects the multiplexed image data to D/A conversion, and outputs the data signal DATAb corresponding to the second image data, as indicated by A6.

Each of the data drivers DRa and DRb outputs the data signals of 30 data lines corresponding to 30 pixels as described above, whereby the data signals of 60 data lines corresponding to 60 pixels are output in total.

A situation in which the width W of the integrated circuit device in the direction D2 is increased due to an increase in the scale of the data driver can be prevented by disposing (stacking) the data drivers DRa and DRb along the direction D1, as shown in FIG. 21. The data driver is configured in various ways depending on the type of display panel. In this case, data drivers of various configurations can be efficiently arranged using the method of disposing the data drivers along the direction D1. FIG. 21 shows the case where the number of data drivers disposed along the direction D1 is two. Note that three or more data drivers may be disposed along the direction D1.

In FIG. 21, each of the data drivers DRa and DRb includes 30 (Q) driver cells disposed along the direction D2. In FIG. 21, the number of pixels of the display panel in the horizontal scan direction (the number of pixels in the horizontal scan direction driven by each integrated circuit device when two or more integrated circuit devices cooperate to drive the data lines of the display panel) is indicated by HPN, the number of data driver blocks (number of block divisions) is indicated by DBN, and the input count of image data to the driver cell in one horizontal scan period is indicated by IN. The input count IN is equal to the image data read count RN in one horizontal scan period described with reference to FIG. 20. In this case, the number Q of driver cells may be expressed as Q=HPN/(DBN×IN). In FIG. 21, since HPN=240, DBN=4, and IN=2, Q=240/(4×2)=30.

The number of subpixels of the display panel in the horizontal scan direction is indicated by HPN, and the degree of multiplexing of the multiplexer of each driver cell is indicated by NDM. In this case, the number Q of driver cells disposed along the direction D2 may be expressed as Q=HPNS/(DBN×IN×NDM). In FIG. 21, since HPNS=240×3=720, DBN=4, IN=2, and NDM=3, Q=720/(4×2×3)=30. For example, when the degree of multiplexing is increased to NDM=6, Q=720/(4×2×6)=15.

When the width (pitch) of the driver cells in the direction D2 is indicated by WD and the width of the peripheral circuit section (e.g. buffer circuit and wiring region) of the data driver block in the direction D2 is indicated by WPCB, the width WB (maximum width) of the first to Nth circuit blocks CB1 to CBN in the direction D2 may be expressed as Q×WD≦WB<(Q+1)×WD+WPCB. When the width of the peripheral circuit section (e.g. row address decoder RD and wiring region) of the memory block in the direction D2 is indicated by WPC, the width WB (maximum width) of the first to Nth circuit blocks CB1 to CBN in the direction D2 may be expressed as Q×WD≦WB<(Q+1)×WD+WPC.

When the number of pixels of the display panel in the horizontal scan direction is indicated by HPN, the number of bits of image data of one pixel is indicated by PDB, the number of memory blocks is indicated by MBN (=DBN), and the read count of image data from the memory block in one horizontal scan period is indicated by RN. In this case, the number of sense amplifiers (sense amplifiers which output one bit of image data) arranged in the sense amplifier block SAB along the direction D2 may be expressed as P=(HPN×PDB)/(MBN×RN). In FIG. 21, since HPN=240, PDB=24, MBN=4, and RN=2, P=(240×24)/(4×2)=720. The number P is the number of effective sense amplifiers corresponding to the number of effective memory cells, and excludes the number of ineffective sense amplifiers such as sense amplifiers for dummy memory cells.

The number of subpixels of the display panel in the horizontal scan direction is indicated by HPN, and the degree of multiplexing of the multiplexer of each driver cell is indicated by NDM. In this case, the number P of sense amplifiers disposed along the direction D2 may be expressed as P=(HPNS×PDB)/(MBN×RN×NDM). In FIG. 21, since HPNS=240×3=720, PDB=24, MBN=4, RN=2, and NDM=3, P=(720×24)/(4×2×3)=720.

When the width (pitch) of each sense amplifier of the sense amplifier block SAB in the direction D2 is indicated by WS, the width WSAB of the sense amplifier block SAB (memory block) in the direction D2 may be expressed as WSAB=P×WS. When the width of the peripheral circuit section of the memory block in the direction D2 is indicated by WPC, the width WB (maximum width) of the circuit blocks CB1 to CBN in the direction D2 may also be expressed as P×WS≦WB<(P+PDB)×WS+WPC.

8. Arrangement of Redundant Cells Corresponding to a Plurality of Read Operations When using the method of reading the image data RN times (RN≧2) in one horizontal scan period, as shown in FIG. 20, it is desirable to provide redundant cells of at least RN wordlines in the memory block.

In FIGS. 22A and 22B, the memory of the display driver is divided into memory blocks MB1, MB2, MB3, and MB4, for example. Each of the memory blocks MB1, MB2, MB3, and MB4 includes memory cells and redundant cells of at least two (RN in a broad sense) wordlines (WLJa and WLJb).

The wordline WLMa is selected in the first read operation (A1 in FIG. 20) in one horizontal scan period during the LCD access shown in FIG. 22A. In FIG. 22A, a defective cell DFM exists corresponding to the wordline WLMa of the memory block MB2 among the memory blocks MB1 to MB4, and the defective address of the defective cell DFM has been programmed in the information storage block ISB.

Therefore, when the LCD row address RAL corresponding to the wordline WLMa of the defective cell DFM has been input and the switching signal JX has become active, the row address decoders RD1 to RD4 select the wordlines WLJa of the redundant cells instead of the wordlines WLMa.

The wordline WLMb is selected in the second read operation (A2 in FIG. 20) in one horizontal scan period during the LCD access shown in FIG. 22B. In this case, the switching signal JX also becomes active in this embodiment. Therefore, the row address decoders RD1 to RD4 select the wordlines WLJb of the redundant cells instead of the wordlines WLMb.

It is possible to appropriately control switching from the defective cell to the redundant cell by providing the redundant cells of two or more (RN) wordlines in the memory block, even when employing the method of reading the image data two or more times in one horizontal period. FIGS. 22A and 22B show an example in which RN=2. Note that it is possible to control switching from the defective cell to the redundant cell in the same manner as in FIGS. 22A and 22B when RN≧3.

9. Electronic Instrument

Figure 23A:
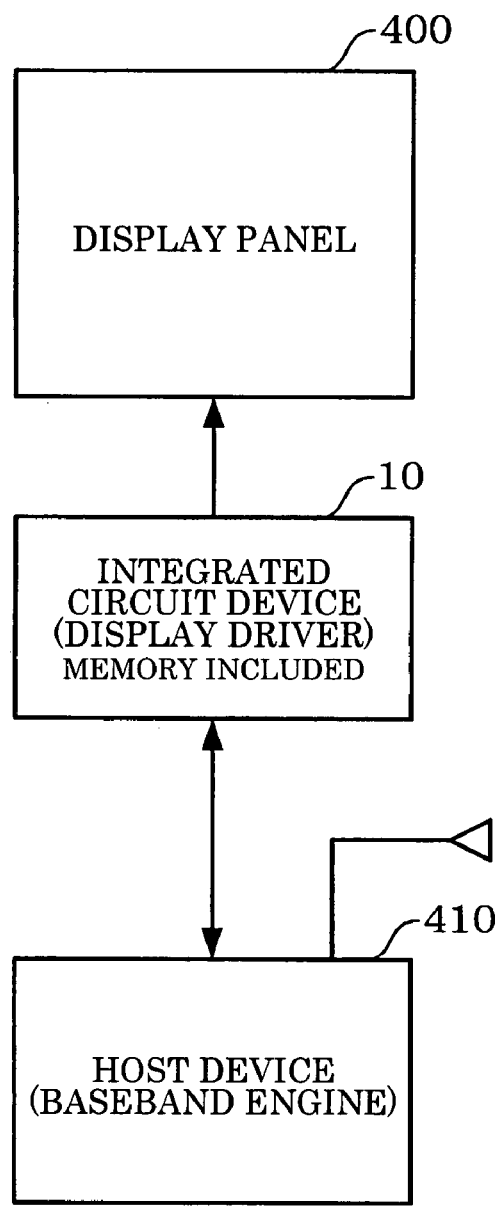
FIGS. 23A and 23B show configuration examples of an electronic instrument.
Figure 23B:
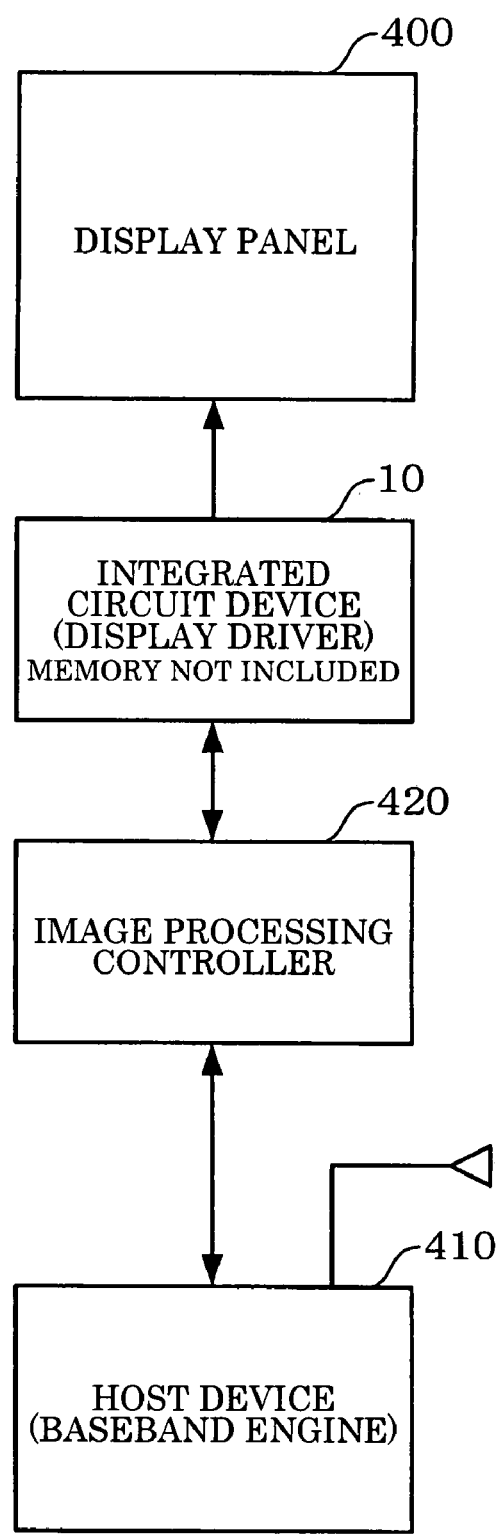

FIGS. 23A and 23B show examples of an electronic instrument (electro-optical device) including the integrated circuit device 10 according to the above embodiment. The electronic instrument may include elements (e.g. camera, operation section, or power supply) other than the elements shown in FIGS. 23A and 23B. The electronic instrument according to this embodiment is not limited to a portable telephone, but may be a digital camera, a PDA, an electronic notebook, an electronic dictionary, a projector, a rear-projection television, a portable information terminal, or the like.

In FIGS. 23A and 23B, a host device 410 is an MPU, a baseband engine, or the like. The host device 410 controls the integrated circuit device 10 (display driver). The host device 410 may also perform a process of an application engine or a baseband engine, or a process of a graphic engine such as compression, decompression, and sizing. An image processing controller 420 shown in FIG. 23B performs a process of a graphic engine such as compression, decompression, or sizing instead of the host device 410.

In FIG. 23A, an integrated circuit device 10 may be used which includes a memory. In this case, the integrated circuit device 10 writes image data from the host device 410 into the memory, and reads the image data from the built-in memory to drive the display panel. In FIG. 23B, an integrated circuit device 10 may be used which does not include a memory. In this case, image data from the host device 410 is written into a memory provided in the image processing controller 420. The integrated circuit device 10 drives the display panel 400 under control of the image processing controller 420.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term (e.g. row address, column address, LCD access, MPU access, output-side I/F region, and input-side I/F region) cited with a different term (e.g. first address, second address, display panel access, host access, first interface region, and second interface region) having a broader meaning or the same meaning at least once in the specification and the drawings can be replaced by the different term in any place in the specification and the drawings.

The redundant cell switching method described with reference to FIGS. 1 to 9 and the like may be applied not only to the integrated circuit device having the configuration described with reference to FIGS. 11 to 13A and the like, but also to integrated circuit devices having other arrangement configurations. For example, the redundant cell switching method may also be applied to the integrated circuit device having the arrangement configuration shown in FIG. 13B. The above embodiment has been described taking an example in which the first address is the row address and the second address is the column address. Note that the invention is not limited thereto. For example, the first and second addresses may be addresses having substantially the same functions as the row address and the column address.

What is claimed is:

1. An integrated circuit device comprising:
  at least one memory block that includes memory cells and a redundant cell;
  an information storage block in which an address of a defective cell of the at least one memory block is programmed and stored as a defective address, the defective cell being replaced by the redundant cell; and
  a switch control circuit that switches access to the defective cell to access to the redundant cell,
  a row address of the defective cell being stored in the information storage block as the defective address,
  the switch control circuit including a first coincidence detection circuit and a second coincidence detection circuit,
  the first coincidence detection circuit receiving a first row address of a first access and the defective address from the information storage block, detecting whether or not the first row address coincides with the defective address, and activating a first switching signal when the first row address coincides with the defective address, the first access being an access from an electro-optical device,
  the second coincidence detection circuit receiving a second row address of a second access and the defective address from the information storage block, detecting whether or not the second row address coincides with the defective address, and activating a second switching signal when the second row address coincides with the defective address, the second access being an access from a host.

2. The integrated circuit device as defined in claim 1, the at least one memory block including:
  a memory cell array in which the memory cells and the redundant cells are disposed;
  a row address decoder that decodes a row address and selects a wordline of the memory cell array; and
  a column address decoder that decodes a column address and selects a bitline of the memory cell array.

3. The integrated circuit device as defined in claim 2,
  the first row address of the first access being input to the row address decoder during the first access, and
  the second row address of the second access being input to the row address decoder and a second column address of the second access being input to the column address decoder during the second access.

4. An integrated circuit device comprising:
  first to Ith memory blocks (I is an integer equal to or larger than two), each of the first to Ith memory blocks including memory cells and a redundant cell;
  an information storage block in which an address of a defective cell of each of the first to Ith memory blocks is programmed and stored as a defective address, the defective cell being replaced by the redundant cell; and
  a switch control circuit that switches access to the defective cell to access to the redundant cell,
  a row address of the defective cell being stored in the information storage block as the defective address,
  the switch control circuit comparing a first row address of a first access with the defective address stored in the information storage block during the first access, and comparing a second row address of a second access with the defective address stored in the information storage block during the second access, the first access being an access from an electro-optical device, the second access being an access from a host,
  the first to Ith memory blocks respectively including first to Ith row address decoders, and
  when a defective cell exists in a Kth memory block ($1 \leq K \leq I$) of the first to Ith memory blocks, not only a Kth row address decoder of the first to Ith row address decoders but also row address decoders other than the Kth row address decoder selecting a wordline of the redundant cells during the first access.

5. The integrated circuit device as defined in claim 4,
  first to Ith bank signals for selecting the first to Ith memory blocks being respectively input to the first to Ith row address decoders, and
  when an Lth bank signal ($1 \leq L \leq I$) of the first to Ith bank signals has become active and an Lth memory block of the first to Ith memory blocks has been selected during the second access, an Lth row address decoder of the first to Ith row address decoders selecting a wordline of the redundant cells, and row address decoders other than the Lth row address decoder not selecting wordlines of the memory cells and the redundant cells.

6. The integrated circuit device as defined in claim 1,
  use instruction information that indicates whether or not to use the redundant cells being programmed and stored in the information storage block,
  the first coincidence detection circuit receiving an instruction signal corresponding to the use instruction information stored in the information storage block, and deactivating the first switching signal when the instruction signal indicates that the redundant cell is not used, and
  the second coincidence detection circuit receiving the instruction signal, and deactivating the second switching signal when the instruction signal indicates that the redundant cell is not used.

7. An integrated circuit device comprising:
  first to Nth circuit blocks (N is an integer equal to or larger than two) disposed along a first direction when a direction from a first side that is a short side of the integrated circuit device toward a third side opposite to the first side is defined as a first direction and a direction from a second side that is a long side of the integrated circuit device toward a fourth side opposite to the second side is defined as a second direction;
  an information storage block in which an address of a defective cell is programmed and stored as a defective address, the defective cell being replaced by a redundant cell; and a switch control circuit that switches access to the defective cell to access to the redundant cell, the first to Nth circuit blocks including at least one memory block, at least one memory block storing image data and including memory cells and the redundant cell, a row address of the defective cell of the at least one memory block being programmed and stored in the information storage block as a defective address, the switch control circuit comparing a first row address of a first access with the defective address stored in the information storage block during the first access, and comparing a second row address of a second access with the defective address stored in the information storage block during the second access, the first access being an access from an electro-optical device, the second access being an access from a host.

8. The integrated circuit device as defined in claim 7, the image data stored in the at least one memory block being read from the at least one memory block into the at least one data driver block RN times (RN≧2) in one horizontal scan period, and the redundant cells of at least RN wordlines being provided in the at least one memory block.

9. An electronic instrument comprising:
the integrated circuit device as defined in claim 1; and
the electro-optical device driven by the integrated circuit device.

10. An electronic instrument comprising:
the integrated circuit device as defined in claim 4; and
the electro-optical device driven by the integrated circuit device.

11. An electronic instrument comprising:
the integrated circuit device as defined in claim 7; and
the electro-optical device driven by the integrated circuit device.

12. The integrated circuit device as defined in claim 1, comprising:
at least one data driver block that drives data lines based on the image data read from the at least one memory block.

13. The integrated circuit device as defined in claim 4, comprising:
at least one data driver block that drives data lines based on the image data read from a corresponding memory block among the first to Ith memory blocks.

14. The integrated circuit device as defined in claim 7,
the first to Nth circuit blocks including at least one data driver block that drives data lines based on the image data read from the at least one memory block.

\* \* \* \* \*